United States Patent
Eto et al.

(10) Patent No.: US 11,810,792 B2
(45) Date of Patent: Nov. 7, 2023

(54) ETCHING METHOD AND SUBSTRATE PROCESSING APPARATUS

(71) Applicant: Tokyo Electron Limited, Tokyo (JP)

(72) Inventors: Takanori Eto, Miyagi (JP); Masasugu Makabe, Miyagi (JP); Sho Saitoh, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 116 days.

(21) Appl. No.: 17/447,306

(22) Filed: Sep. 10, 2021

(65) Prior Publication Data
US 2022/0084836 A1    Mar. 17, 2022

(30) Foreign Application Priority Data

Sep. 14, 2020  (JP) ................. 2020-154147
Jul. 14, 2021   (JP) ................. 2021-116486

(51) Int. Cl.
*H01L 21/311*   (2006.01)
*H01J 37/32*    (2006.01)
*H01L 21/768*   (2006.01)

(52) U.S. Cl.
CPC .. *H01L 21/31116* (2013.01); *H01J 37/32449* (2013.01); *H01J 2237/334* (2013.01); *H01L 21/76802* (2013.01)

(58) Field of Classification Search
None
See application file for complete search history.

(56) References Cited

U.S. PATENT DOCUMENTS

2019/0067030 A1* 2/2019 Saitoh ................. H01L 27/1207
2019/0228983 A1* 7/2019 Sakurai ............... H01L 21/3065

FOREIGN PATENT DOCUMENTS

JP    2014-090022    5/2014
JP    2019-036612    3/2019

* cited by examiner

*Primary Examiner* — Roberts P Culbert
(74) *Attorney, Agent, or Firm* — IPUSA, PLLC

(57) ABSTRACT

An etching method includes mounting a substrate on a stage in a processing chamber, the substrate including a laminate film. The etching method includes supplying process gas to the processing chamber, the process gas including at least one of fluorocarbon gas or hydrofluorocarbon gas. The etching method includes selecting, based on a combination of material of a silicon-containing insulating layer and material of an underlying layer, a surface temperature range of at least one member of a first member or a second member in the processing chamber, the first member facing the substrate, and the second member being provided to encircle the substrate. The etching method includes adjusting a surface temperature of the one member to be within the selected surface temperature range. The etching method includes forming a plasma in the processing chamber to which the process gas is supplied, thereby etching the silicon-containing insulating layer.

15 Claims, 15 Drawing Sheets

36a  36b

ETCHING METHOD AND SUBSTRATE PROCESSING APPARATUS

CROSS-REFERENCE TO RELATED APPLICATIONS

This patent application claims priority to Japanese Patent Applications Nos. 2020-154147, filed Sep. 14, 2020, and 2021-116486, filed Jul. 14, 2021, the contents of which are incorporated herein by reference in their entirety.

TECHNICAL FIELD

The present disclosure relates to an etching method and a substrate processing apparatus.

BACKGROUND

Manufacturing a three-dimensional (3D) stacked semiconductor memory such as a 3D NAND flash memory includes an etch process to form holes in silicon-containing insulating layers, by using a plasma. In some cases, in an etch process to form a device structure of the 3D-NAND, when a silicon oxide layer is etched to thereby form holes in the silicon oxide layer, a silicon layer in a substrate, as well as a given metal layer located in an intermediate portion of the silicon layer, are etched simultaneously with high selectivity between the layers. In such an etch process, relatively shallow holes are formed to expose the given metal layer, and further, deep holes are formed to expose the silicon layer located underneath the given metal layer. In this case, the edge process requires a higher selectivity ratio of the silicon oxide layer to an underlying metal layer. Also, for a device structure other than the 3D-NAND device structure, there is demand for an etch process that provides lower thickness losses in a given underlying layer and a higher selectivity ratio of an etching layer to the given underlying layer.

In order to ensure a higher selectivity ratio of the etching layer to the given underlying layer, one approach is to form a protective layer on a tungsten layer under a process condition in which a high deposition rate is set. For example, Japanese Unexamined Patent Application Publication No. 2014-90022, which is hereinafter referred to as Patent Document 1, proposes a plasma processing method that can form a protective layer on a surface of an etch-stop layer, during etching of an oxide layer, while suppressing closing of a hole opening.

Japanese Unexamined Patent Application Publication No. 2019-36612, which is hereinafter referred to as Patent Document 2, proposes a method of etching a silicon-containing insulating layer with a plasma. In the method, in order to provide both appropriate selectivity for a metal layer and high mask selectivity, process gas that includes at least (i) either fluorocarbon gas or hydrofluorocarbon gas, (ii) oxide, (iii) nitride, and (iv) CO, is supplied to a processing chamber, and the plasma is formed in the processing chamber.

CITATION LIST

Patent Document

Patent Document 1: Japanese Unexamined Patent Application Publication No. 2014-90022
Patent Document 2: Japanese Unexamined Patent Application Publication No. 2019-36612

SUMMARY

According to one aspect of the present disclosure, an etching method is provided. The etching method includes mounting a substrate on a stage in a processing chamber, the substrate including a laminate film that includes at least (i) a silicon-containing insulating layer, (ii) an underlying layer disposed in the silicon-containing insulating layer, and (iii) a mask layer disposed in an upper layer of the silicon-containing insulating layer. The etching method includes supplying process gas to the processing chamber, the process gas including fluorocarbon gas or hydrofluorocarbon gas. The etching method includes selecting, based on a combination of material of the silicon-containing insulating layer and material of the underlying layer, a surface temperature range of at least one member of a first member or a second member in the processing chamber, the first member facing the substrate, and the second member being provided to encircle the substrate. The etching method includes adjusting a surface temperature of the one member to be within the selected surface temperature range. The etching method includes forming a plasma in the processing chamber to which the process gas is supplied, thereby etching the silicon-containing insulating layer.

BRIEF DESCRIPTION OF THE DRAWINGS

FIGS. 5A to 5D are diagrams illustrating an example of polymers over a substrate at different temperatures of a top plate and the like;

DETAILED DESCRIPTION

One or more embodiments of the present disclosure will be described with reference to the drawings. Note that in each drawing, the same numerals denote the same components, and duplicate description for the components may be omitted.

[Substrate Processing Apparatus]

Figure 1:
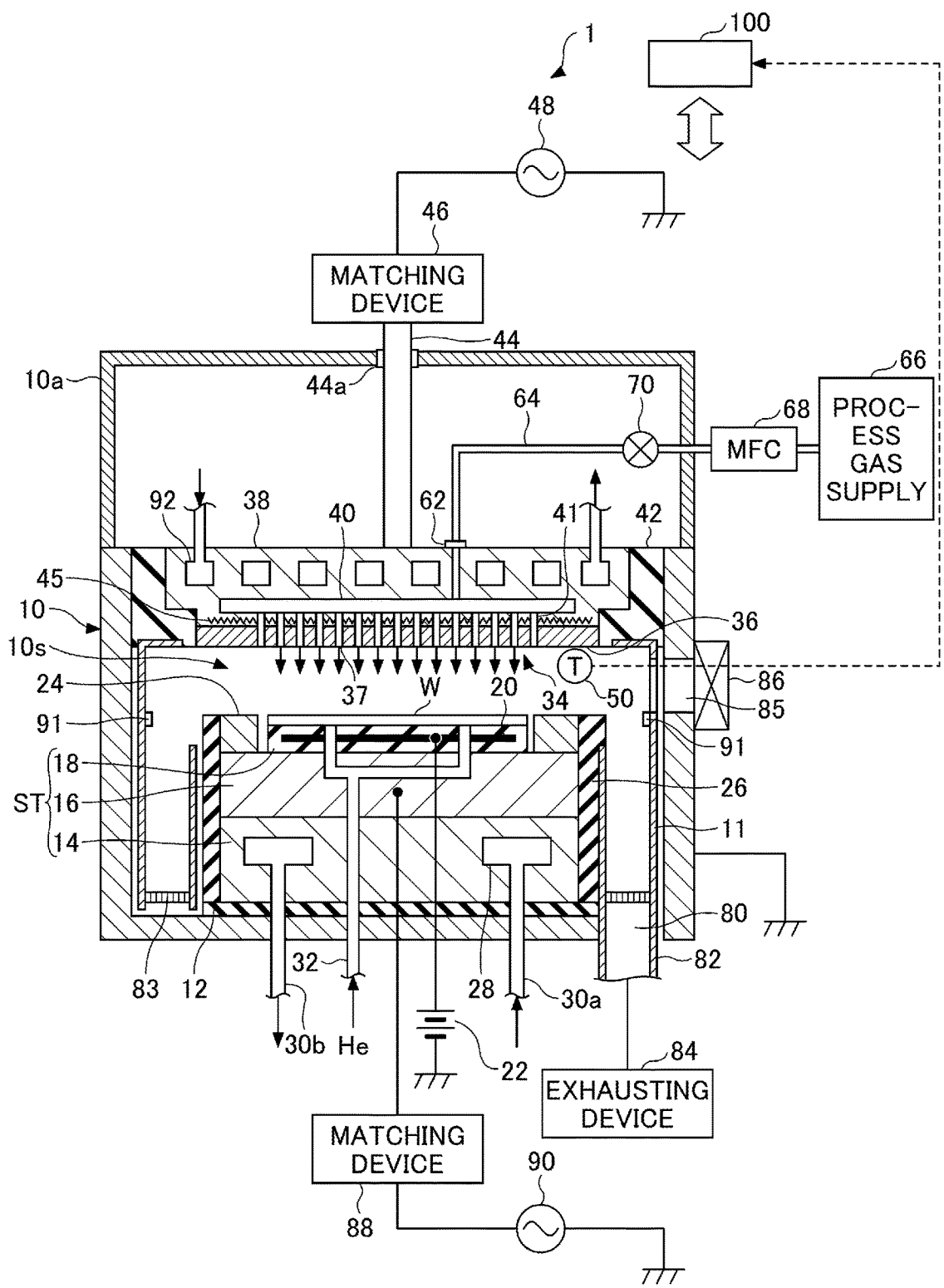
FIG. 1 is a cross-sectional view schematically illustrating an example of a substrate processing apparatus according to one embodiment.

A substrate processing apparatus 1 according to one embodiment will be described with reference to FIG. 1. FIG. 1 is a cross-sectional view schematically illustrating an example of the substrate processing apparatus 1 according to one embodiment. The substrate processing apparatus 1 is an apparatus that performs a predetermined plasma process with respect to a substrate. For example, the substrate processing apparatus 1 includes a cylindrical processing chamber 10 formed of an aluminum metal of which the surface is anodized. The processing chamber 10 is grounded. A processing compartment 10s at which a substrate W is processed is provided in the processing chamber 10.

A stage ST is provided on the bottom side of the processing chamber 10. The stage ST includes a bottom electrode plate 16 and an electrostatic chuck 18. The stage ST may also include a metal plate 14. In the present embodiment, the cylindrical metal plate 14 is disposed on an insulating plate 12 formed of ceramic or the like. The bottom electrode plate 16 formed of, e.g., aluminum is provided on the metal plate 14. The substrate W is mounted on the electrostatic chuck 18. The substrate W is an example of a semiconductor wafer.

The electrostatic chuck 18 attracts and holds the substrate W by an electrostatic force. The electrostatic chuck 18 has a structure in which an electrode 20 formed of a conductive film is interposed between a pair of insulating layers or between a pair of insulating sheets. A direct current power source 22 is electrically coupled to the electrode 20. When the direct current power source 22 applies a direct current voltage to the electrode 20, the resulting column force causes the substrate W to be attracted to the electrostatic chuck 18, so that the electrostatic chuck 18 holds the substrate W.

A conductive edge ring 24 (which is also referred to as a focus ring) formed of silicon is disposed on the bottom electrode plate 16 to encircle the edge of the substrate W. An insulating ring 26 is provided on side surfaces of the bottom electrode plate 16 and the metal plate 14, in order to cover the outer peripheries of those plates. The insulating ring 26 is cylindrical and is formed of quartz, for example.

A coolant flow path 28 is provided in an interior of the metal plate 14. For example, the coolant flow path 28 is located annularly around the metal plate 14. The coolant flow path 28 is coupled, via pipe lines 30a and 30b, to a chiller unit provided outside the processing chamber 10. A coolant, e.g., brine, at a predetermined temperature is circulated through the coolant flow path 28, by the chiller unit. The substrate processing apparatus 1 is configured to enable the temperature of the bottom electrode plate 16 to be controlled by regulating the temperature or flow rate of the coolant that is supplied to the coolant flow path 28 from the chiller unit.

Heat transfer gas, e.g., He gas, from a heat transfer gas supply not illustrated is supplied, via a gas supply line 32, to a portion between a top of the electrostatic chuck 18 and a bottom of the substrate W.

A showerhead 34 that serves as a top electrode is provided above the stage ST, so as to face the stage ST. The showerhead 34 and the stage ST are used as a pair of electrodes consisting of the top electrode and the bottom electrode. A space in the processing compartment 10s between the showerhead 34 and the stage ST is given as a plasma formation space.

The showerhead 34 is supported at a top portion of the processing chamber 10, through the insulating ring 42. The showerhead 34 includes a top plate 36 of which the bottom is exposed to the plasma formation space, and includes a base member 38 that supports the top plate 36. The insulating ring 42 surrounds the outer peripheries of the top plate 36 and the base member 38. The insulating ring 42 is an annular member that is formed of an insulating member.

Gas holes 37 through which process gas is supplied to the processing chamber 10 are formed in the top plate 36. The top plate 36 is formed of silicon (Si) or silicon carbide (SiC), for example.

For example, the base member 38 is formed of a conductive material, such as an aluminum metal of which the surface is anodized. The top plate 36 is removably supported at a bottom portion of the base member 38. A heater 45 used to adjust the surface temperature of the top plate 36 is provided proximal to the top plate 36 in the base member 38. The heater 45 may be provided on the top plate 36. The heater 45 is controlled to adjust the surface temperature (bottom temperature) of the top plate 36. A gas diffusion compartment 40 through which process gas is supplied to the gas holes 37 is formed in an interior of the base member 38. Gas lines 41 are formed to be located in a lower portion of the base member 38, such that the base lines 41 are situated at a bottom portion of the diffusion compartment 40. The gas lines 41 communicate with the respective gas holes 37.

A gas inlet 62 for introducing process gas to the gas diffusion compartment 40 is provided at the base member 38. One end of a gas supply line 64 is coupled to the gas inlet 62. A process gas supply 66 is coupled to another end of the gas supply line 64. A mass flow controller (MFC) 68 and a valve 70 for opening or closing a gas passage are provided in this order from the upstream side of the gas supply line 64. Also, process gas for plasma etching or the like is supplied from the process gas supply 66 to the gas diffusion compartment 40, via the gas supply line 64. Further, a shower of process gas is supplied from the gas diffusion compartment 40 to the processing chamber 10, via the gas lines 41 and the gas holes 37.

A coolant flow path 92 is formed in the interior of the base member 38. The coolant flow path 92 is coupled, via a given pipe line, to the chiller unit provided outside the processing chamber 10. A coolant is circulated by the chiller unit, through the coolant flow path 92. In such a manner, the showerhead 34, which is used as a temperature controlling mechanism, constitutes part of a coolant circulation system, which includes the coolant flow path 92, the given pipe line, and the chiller unit. In response to receiving a control signal from a controller 100 described below, the chiller unit is configured to regulate a given temperature or flow rate of the coolant to be supplied to the coolant flow path 92. The controller 100 also causes the temperature or flow rate of the coolant that is supplied to the coolant flow path 92 to be regulated. By regulating the temperature or flow rate of the coolant to be supplied to the coolant flow path 92, the surface temperature of the top plate 36 can be adjusted.

A first radio frequency (RF) power source 48 is electrically coupled to the showerhead 34, via a low pass filter (LPF) not illustrated, a matching device 46, and a power feed rod 44, where the showerhead serves as a top electrode. The first RF power source 48 is a power source that outputs RF power for exciting a plasma. The first RF power source 48 supplies RF power set at a frequency (e.g., 60 MHz) in the range of 13.56 MHz to 100 MHz, to the showerhead 34. The matching device 46 matches internal (output) impedance of the first RF power source 48 with load impedance. While a plasma is formed in the processing chamber 10, the matching device 46 performs matching between the output impedance of the first RF power source 48 and the load impedance, such that the output impedance is equal to the load impedance.

A cylindrical ground conductor 10a is provided to extend upward from the sidewall of the processing chamber 10, so as to be situated at a higher level than the showerhead 34. A top wall portion of the ground conductor 10a is electrically insulated from the power feed rod 44, with a cylindrical insulating member 44a.

A second RF power source 90 is electrically coupled to the bottom electrode plate 16 via a matching device 88. The second RF power source 90 is a power source that outputs RF power for drawing ions (for a bias voltage) and supplies, to the bottom electrode plate 16, the RF power at a frequency, e.g., 2 MHz, in the range of 300 kHz to 13.56 MHz. The matching device 88 matches between internal (output) impedance of the second RF power source 90 and load impedance. While a plasma is formed in the processing chamber 10, the matching device 88 performs matching between the internal impedance of the second RF power source 90 and the load impedance, such that the internal impedance is equal to the load impedance.

An exhaust port 80 is provided at the bottom of the processing chamber 10, and an exhausting device 84 is coupled, via an exhaust line 82 to the exhaust port 80. The exhausting device 84 includes a vacuum pump such as a turbomolecular pump, and can depressurize the processing chamber 10 up to an appropriate vacuum level. A load port 85 for a given substrate W is attached to an inner sidewall of the processing chamber 10. The load port 85 can be open or closed by a gate valve 86. A shield 11 against deposits is removably provided along the inner wall of the processing chamber 10 to prevent byproducts (deposits) caused by an etch from adhering to the inner wall of the processing chamber 10. The shield 11 against deposits is also provided on the outer periphery of the insulating ring 26. An exhaust plate 83 is provided between a given shield 11 disposed on the inner sidewall of the processing chamber 10 and a given shield 11 disposed on the outer periphery of the insulating ring 26. The shield 11 against deposits, as well as the exhaust plate 83, are preferably formed of aluminum coated with a ceramic such as $Y_2O_3$.

A conductive member (GND block) 91 is provided at a portion of the shield 11 in the inner wall of the processing chamber 10, so as to be located at a height that is approximately the same as that of the substrate W. The conductive member 56 is coupled to a ground so as to constitute an equivalent DC circuit. In such a manner, abnormal discharge is prevented.

In such a configuration, the controller 100 controls the entire operation of the substrate processing apparatus 1. The controller 100 is implemented by, for example, a computer, and controls each component in the substrate processing apparatus 1. The controller 100 causes an etch process of a given substrate W to be performed based on a recipe that is stored in a storage. During the etch process, the controller 100 controls the surface temperature of the top plate 36. A thermometer 50 is provided on the bottom of the top plate 36 or proximal to the top plate 36. As the thermometer 50, a thermocouple, a thermography device, a laser interferometer, or the like can be used. However, the thermometer 50 is not limited to the examples described above. The thermometer 50 measures the surface temperature (temperature of a given surface of the top plate 36 that faces the stage ST or a given substrate W) of the top plate 36 and then transmits, to the controller 100, a value indicating the measured temperature by the thermometer 50. In response to receiving the value indicating the measured temperature, the controller 100 controls a heating temperature at the heater 45 to thereby adjust the surface temperature of the top plate 36 to an appropriate temperature.

Note that in the substrate processing apparatus 1 according to the present embodiment, the first RF power source 48 applies RF power for exiting a plasma to the showerhead 34, and the second RF power source 90 applies RF power for drawing ions to the bottom electrode plate 16. However, both the first RF power source 48 and the second RF power source 90 may be coupled to the bottom electrode plate 16, such that both RF power for exciting a plasma and RF power for drawing ions are applied to the bottom electrode plate 16. Alternatively, without using the second RF power source 90, the first RF power source 48 may be coupled to the showerhead 34 or the bottom electrode plate 16, such that the first RF power source 48 applies RF power for exciting a plasma are applied to a corresponding component among the showerhead 34 and the bottom electrode plate 16.

[Film Structure of Substrate]

Figure 2:
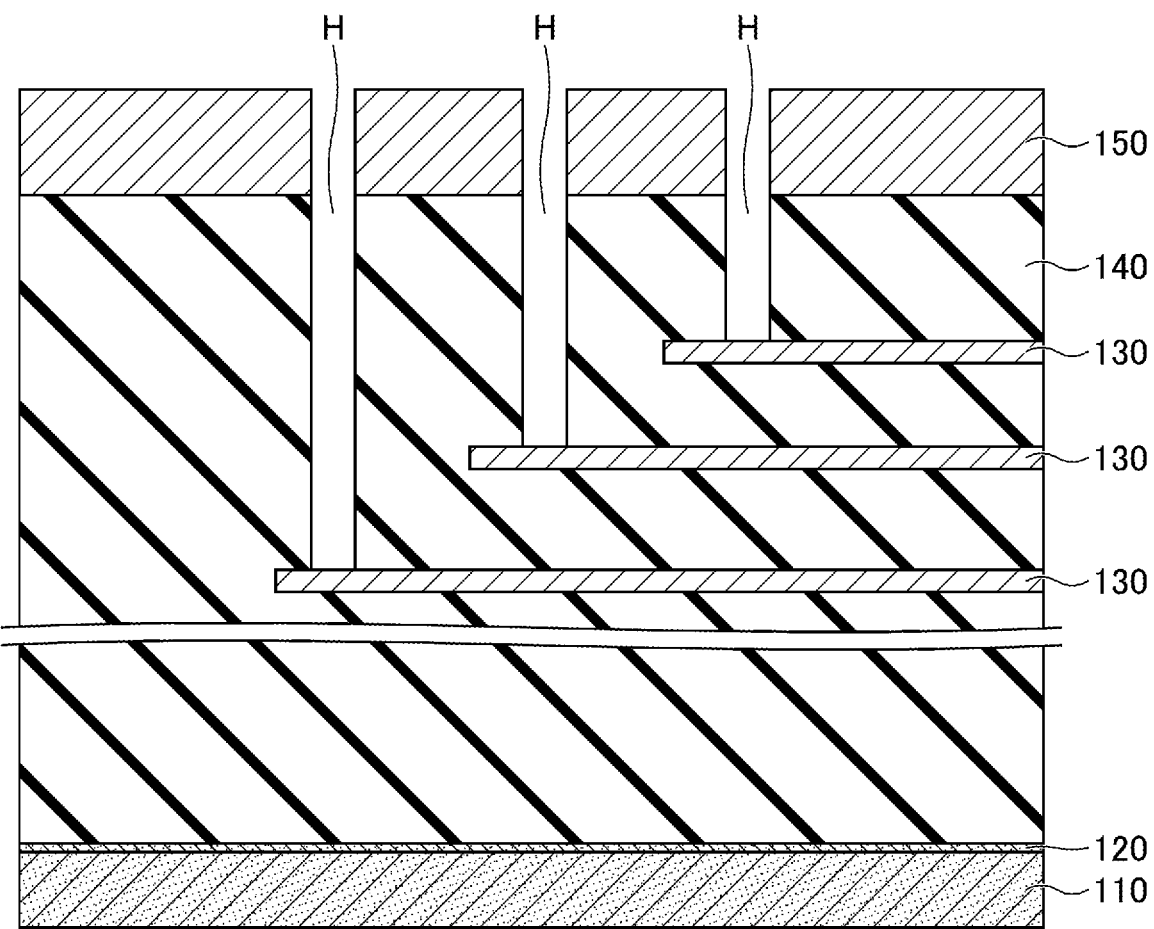
FIG. 2 is a diagram illustrating an example of a laminate film of a 3D-NAND flash memory according to one embodiment.

Hereafter, the film structure of the substrate will be described with reference to FIG. 2. FIG. 2 is a diagram illustrating an example of a laminate film of a 3D-NAND flash memory according to one embodiment. In a process of forming the 3D-NAND, a multilevel contact (hereafter also referred to as an MLC) is formed such that holes are formed to different depth levels at which tungsten (W) layers 130 are formed, where each tungsten layer 130 serves as an electrode.

In this example, a laminate structure is composed of the tungsten layers 130 and the silicon oxide layer 140, which are included in a laminate film described below. The tungsten layer 130 may have a multilayer structure that consists of, for example, sixty layers to two hundred layers. The silicon oxide layer 140 is an example of a silicon-containing insulating layer. The tungsten layer 130 is an example of an underlying layer that is disposed in a silicon-containing insulating layer.

A mask layer 150 is disposed in an upper layer of the silicon oxide layer 140. Note that the mask layer 150 may be an organic film or may be formed of another material. A silicon (Si) layer 110 and a nitride silicon (SiN) layer 120 are disposed below the tungsten layers 130 that are located at different depth levels.

With use of the film structure described above, the substrate W includes a laminate film that includes at least (i) the silicon oxide layer 140, (ii) one or more tungsten layers 130 inside the silicon oxide layer 140, and (iii) the mask layer 150 disposed in an upper layer of the silicon oxide layer 140.

The silicon oxide layer 140 is etched to different depth levels at which the respective tungsten layers 130 are formed. With advanced generation of device structures, it is assumed that the number of stacked layers is further increased, thereby resulting in an increased aspect ratio (AR). Accordingly, the etch time would increase.

In light of the situation described above, in an etch process over a long time period, it is required to increase a selectivity ratio of the silicon oxide layer 140 to a given tungsten layer 130. In particular, when the silicon oxide layer 140 is etched at a location corresponding to a given tungsten layer 130 that is located at a shallow level, among the tungsten layers 130, a longer etch time (over etch time) is required after the given tungsten layer 130 is exposed. For this reason, such an etch process might require a higher selectivity radio of the silicon oxide layer 140 to a given tungsten layer 130. Also, even in a case of a 3D-NAND structure other than the MLC, it is desirable to provide a process in which a higher selectivity radio of a given etching layer to a given underlying layer is obtained, thereby resulting in lower thickness losses in the given underlying layer.

Therefore, in an etching method according to the present embodiment, the following steps are performed in order to adjust selectivity for an underlying metal layer such as a tungsten layer 130. In the etching method, a first step in which a substrate W is mounted on the stage ST in the processing chamber 10 is performed. The substrate W includes a laminate film that includes at least (i) a silicon-containing insulating layer, (ii) one or more underlying layers each disposed in the silicon-containing insulating layer, and (iii) a mask layer disposed in an upper layer of the silicon-containing insulating layer. Then, a second step in which process gas that includes at least one of fluorocarbon gas or hydrofluorocarbon gas is supplied to the processing chamber 10 is performed. Next, a third step is performed in which a surface temperature range of at least one member selected from among (i) a member that faces the substrate on the stage and (ii) a member provided to encircle the substrate, is selected based on a combination of material of the silicon-containing insulating layer and material of the underlying layer. Subsequently, a fourth step is performed in which within the selected surface temperature range of the at least one member selected in the third step, a surface temperature of a corresponding member is adjusted to an appropriate temperature. Then, a fifth step is performed in which a plasma is formed in the processing chamber 10 to which the process gas is supplied and then a silicon-containing insulating layer (in this example, the silicon oxide layer 140) is etched with the plasma. In the third step, for example, the member that faces the substrate on the stage is the top plate 36.

Among CF-based radicals and ions included in a plasma from process gas that contains fluorocarbon gas or hydrofluorocarbon gas, types of CF-based polymers that adhere to the substrate W can be determined based on a given surface temperature of the top plate 36. Therefore, in the etching method according to the present embodiment, by adjusting the surface temperature of the top plate 36, one or more types of CF-based polymers adhering to the substrate W are determined. Thus, a higher selectivity ratio of the silicon oxide layer 140 to a given tungsten layer 130 that is an underlying layer can be obtained while maintaining an etch rate of the silicon oxide layer 140, which is an example of an etching film.

Note that the process gas may include rare gas. Examples of the rare gas include He gas, Ar gas, and the like. In this description, although the silicon oxide layer 140 is described as an example of an etching film, the etching film is not limited to the example described above. As long as the etching layer is silicon-containing insulating layer, it is sufficient. Examples of the silicon-containing insulating layer include (i) a silicon oxide layer, (ii) a silicon nitride layer, (iii) a laminate structure of one or more silicon oxide layers and one or more silicon nitride layers, and (iv) a low-K film layer such as an organic-containing silicon oxide, and (iv) any combination of at least two selected from (i) to (iv) above.

Also, in this description, the tungsten layer 130 is described as an example of an underlying layer for an etching film. However, the underlying layer is not limited to the example described above. As long as the underlying layer is a conductive layer, it is sufficient. Another example of the conductive layer includes a metal layer or a silicon layer. Examples of the material of the metal layer include tungsten, molybdenum (Mo), titanium (Ti), aluminum (Al), and copper (Cu). Note that an example of the silicon layer includes a silicon-containing conductive layer, such as poly-silicon (poly-Si) or amorphous silicon. The silicon layer may also be a silicon substrate formed of single crystal silicon. When a given etching film is not a silicon nitride layer, a silicon nitride layer may be used as an underlying layer that requires appropriate selectivity.

In some cases, when an etch process is achieved for a 3D-NAND structure other than the MLC, it is desirable to provide a higher selectivity ratio of an etching film to an underlying layer, thereby resulting in lower thickness losses in the underlying layer. In such a structure, the underlying layer for the etching film is not limited to a conductive layer such as a metal layer or a silicon layer. For example, as in a self-aligned contact (SAC) structure, the etching film is a silicon oxide film, and the underlying layer may be a silicon nitride film. Alternatively, as in a via structure, the etching film includes at least one of a silicon oxide layer or a low-K film layer, and the underlying layer may include at least one of a silicon carbide layer or a silicon carbide nitride layer. In such cases, likewise, it is desirable to have lower thickness losses in the underlying layer, and the etching method according to the present embodiment can be applied to the cases described above.

Figure 3:
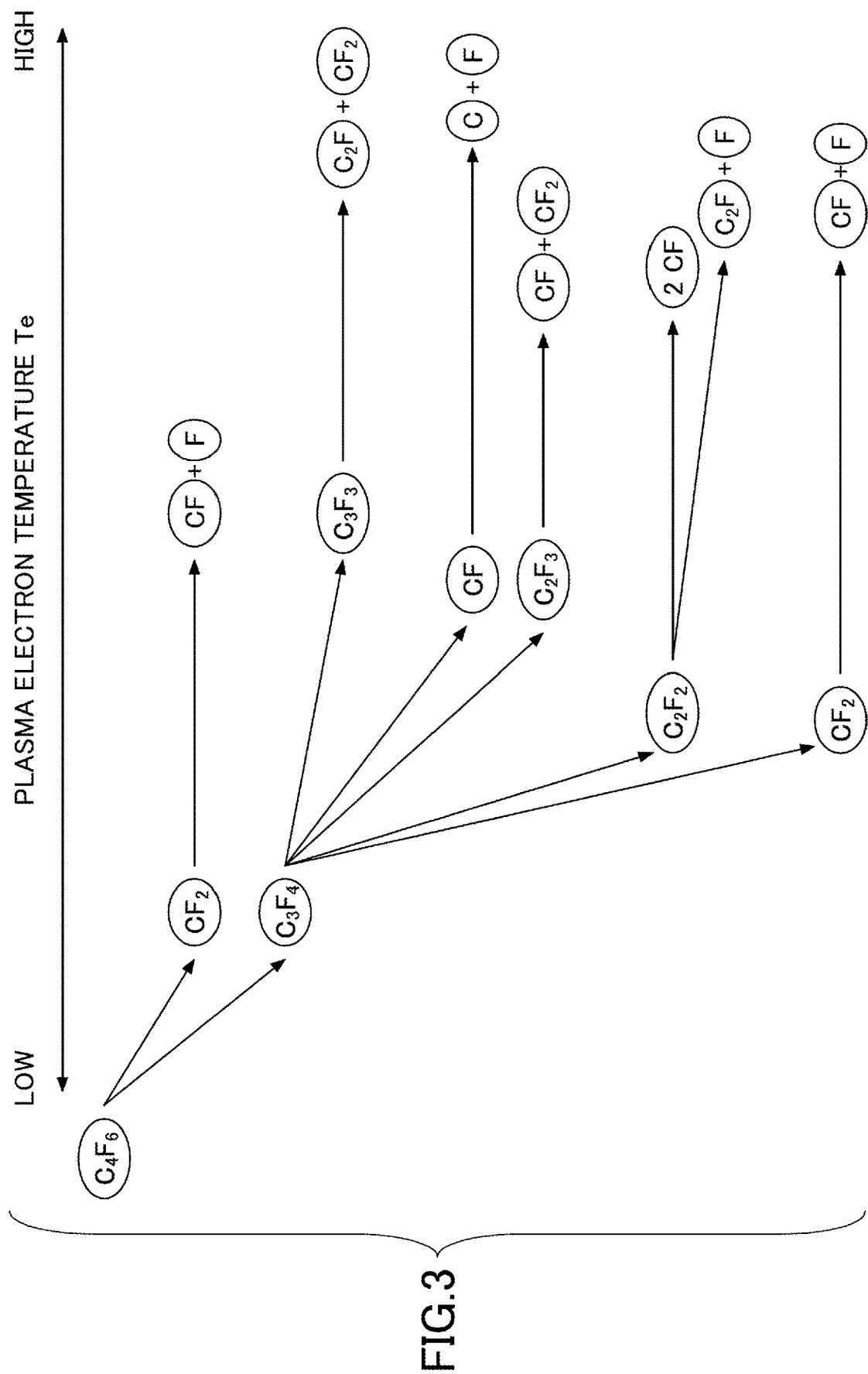
FIG. 3 is a diagram illustrating an example of the relationship between a plasma electron temperature and dissociation in gas according to one embodiment.
Figure 4:
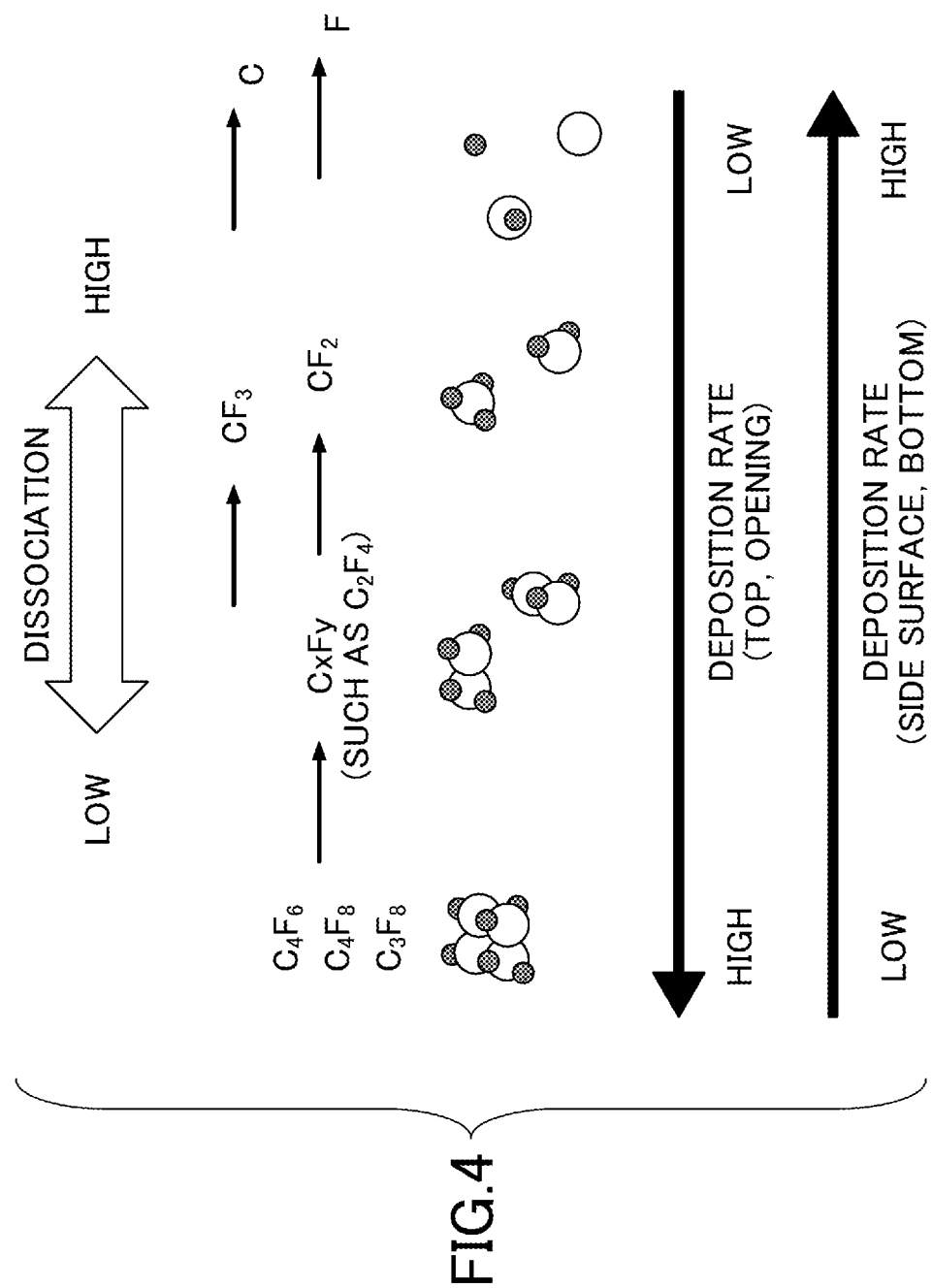
FIG. 4 is a diagram illustrating an example of the relationship between the dissociation in gas and a deposition rate, with respect to each surface of a hole according to one embodiment.

Dissociation in fluorocarbon gas will be described with reference to FIG. 3 and FIG. 4. FIG. 3 is a diagram illustrating an example of the relationship between a plasma electron temperature and dissociation in gas according to one embodiment. FIG. 4 is a diagram illustrating an example of the relationship between the dissociation in gas and a deposition rate, with respect to each surface of a given hole according to one embodiment.

In FIG. 3, the horizontal axis represents the plasma electron temperature Te, and FIG. 3 illustrates the relationship between the plasma electron temperature Te and dissociation in $C_4F_6$ gas. When the plasma electron temperature Te increases, dissociation in gas is likely to occur with collision of electrons with gas, because energy of a single electron increases. Further, precursors, such as highly dissociated radicals or ions resulting from further ionization, are likely to be formed. The formed precursors contribute to polymer deposits. Radical precursors are isotropically reacted at the substrate W, through a plasma, while ionic precursors are anisotropically reacted. Also, precursors deposited on a given etching film are used as etchants that facilitate etching of the given etching film by interaction with ions that are drawn into the substrate W, where the ions are drawn based on radio frequency power for drawing ions.

As illustrated in FIG. 3, if $C_4F_6$ gas, as fluorocarbon gas, is supplied to the processing chamber 10, in a case where the plasma electron temperature Te is low, dissociation in $C_4F_6$ gas is less likely to be facilitated. In this case, the number of lowly dissociated precursors ($C_3F_4$ radicals, $C_3F_4^+$ ions, and the like) are increased, while the number of highly dissociated precursors ($CF_2$ radicals, $CF_2^+$ ions, and the like) are reduced. In contrast, if the plasma electron temperature Te increases, dissociation in $C_4F_6$ gas is promoted, thereby resulting in an increased number of highly dissociated CF radicals, while reducing the number of lowly dissociated precursors. In other words, the number of lowly dissociated precursors, such as $C_3F_4$ radicals, that have a high adsorption coefficient, is decreased with obtaining an increased number of highly dissociated precursors, such as $CF_8$ radicals, that have a low adsorption coefficient. Note, however, that as illustrated in FIG. 4, in a plasma formed in the processing compartment 10s, the highly dissociated precursors, as well as lowly dissociated precursors, exist, and thus a ratio between a highly dissociated precursor and a lowly dissociated precursor might vary.

Although FIG. 3 illustrates a dissociation pattern for $C_4F_6$ gas, dissociation in fluorocarbon gas other than $C_4F_6$ gas is also facilitated in accordance with a given plasma electron temperature Te, as illustrated in FIG. 4, where $C_4F_8$ gas, $C_3F_8$ gas, $C_6F_6$ gas, and $C_5F_8$ gas are used as the fluorocarbon gas. Also, instead of the fluorocarbon gas, if hydrofluorocarbon gas such as $C_2H_2F_4$ and $C_3H_2F_4$ is employed as additive gas, dissociation in the hydrofluorocarbon gas is facilitated in accordance with a given plasma electron temperature Te. Precursors such as $CF_3$ radicals and $CF_3^+$ ions are formed depending on gas species employed.

Precursors, such as $C_2F_2$ radicals and $C_2F^+$ ions, have properties intermediate between the lowly dissociated precursor and the highly dissociated precursor. Note that in this description, precursors, such as $C_2F_2$ radicals and $C_2F^+$ ions, are referred to as lowly dissociated precursors each expressed by $C_xF_y$ (x≥2 and y≥1). The lowly dissociated precursors are distinguished from highly dissociated precursors each expressed by CFz (z≥1).

Therefore, the lowly dissociated precursors have a high adsorption coefficient, and are likely to adhere to a top of the mask layer 150 or a top (side surface) at a hole opening. Thus, the lowly dissociated precursors are likely to be reacted at the top or side surface of the mask layer 150. As a result, polymers are formed on the top and side surface of the mask layer 150. Accordingly, the lowly dissociated precursors hardly reach the bottom and side surface of a given hole H formed in the silicon oxide layer 140.

In contrast, the highly dissociated precursors have a low adsorption coefficient, and are less likely to adhere to the top and side surface of the mask layer 150. Thus, the highly dissociated precursors are less likely to be reacted at the top or side surface of the mask layer 150. In other words, the highly dissociated precursors are likely to reach the side surface and bottom of a given hole H formed in the silicon oxide layer 140. Accordingly, in comparison to the lowly dissociated precursors, the highly dissociated precursors are more likely to lead to the formation of polymers at the side surface and bottom of a given hole H formed in the silicon oxide layer 140. As a result, selectivity for a given tungsten layer 130 is set more appropriately.

In addition to consideration of the above-mentioned plasma electron temperature Te, types of polymers to adhere to the substrate W can be determined based on a given temperature of the top plate 36 and a given temperature of the sidewall of the processing chamber 10 that is spatially viewed from the substrate W. FIGS. 5A to 5D are diagrams illustrating an example of polymers over the substrate W, at different temperatures of the top plate and the like.

Figure 5A:
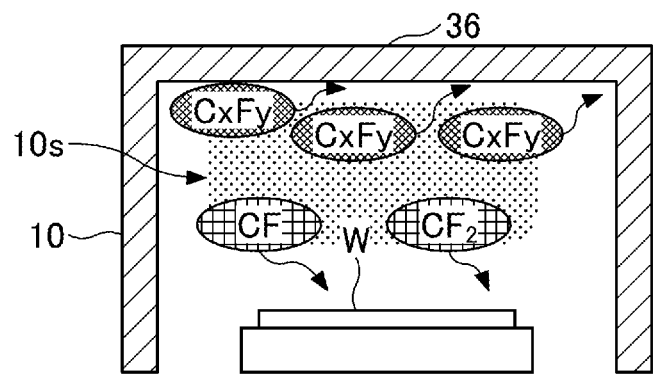

As illustrated in FIG. 5A, if the temperature of at least one of the top plate 36 or the sidewall of the processing chamber 10 that is spatially viewed from the substrate W is adjusted to a low temperature, heavy polymers having a high adsorption coefficient, such as lowly dissociated CxFy, can be selectively absorbed onto the inner surface of the top plate 36 or the inner surface of the sidewall of the processing chamber 10. In this case, by adjusting the temperature of the sidewall of the processing chamber 10 to a low temperature, light polymers having a low adsorption coefficient, such as highly dissociated CFz, can be also selectively absorbed onto a given tungsten layer 130 (underlying layer) of the substrate W.

Figure 5B:
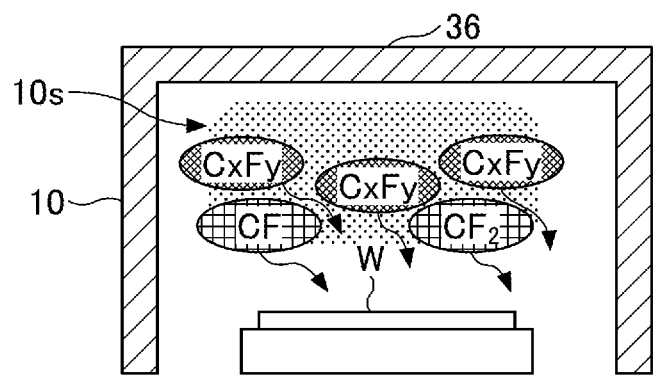
Figure 5C:
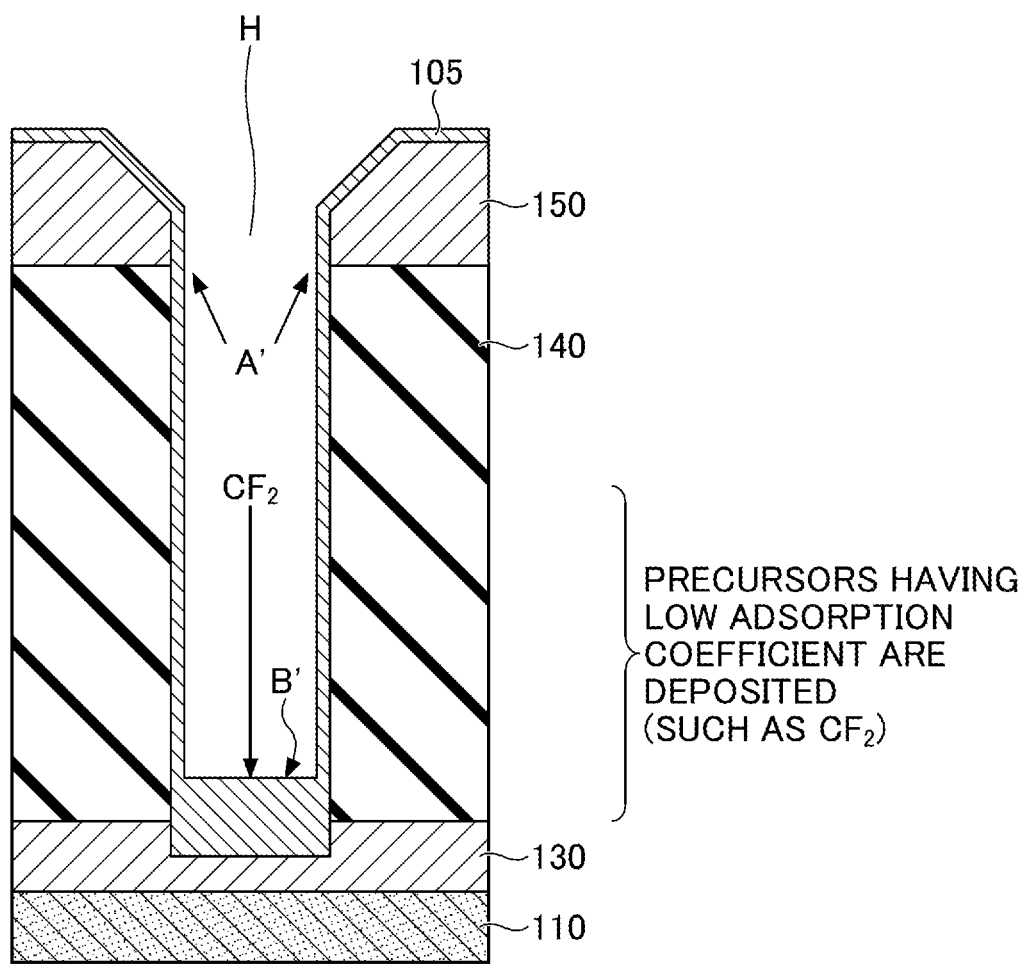

In this case, as illustrated in FIG. 5C, lowly dissociated CxFy polymers are less likely to adhere to the mask layer 150, and consequently mask selectivity is reduced. However, the number of CFz polymers that are transferred to a given hole is increased and thus more appropriate selectivity for a given tungsten layer 130 is obtained. In other words, as illustrated in FIG. 5A, by adjusting the temperature of the top plate 36 or the like to a low temperature, a smaller number of lowly dissociated precursors having a high adsorption coefficient to adhere to a given substrate W is obtained, and thus highly dissociated precursors having a low adsorption coefficient adhere to the given substrate W. Because the precursors, such as $CF_2$, having a low adsorption coefficient, they are less likely to adhere to the mask layer 150, and thus are transferred to the bottom of a given hole H. In such a case, without narrowing the opening of the given hole H in the mask layer 150 (see an opening A' in FIG. 5C), a greater number of CFz precursors that can be transferred to a given tungsten layer 130 exposed to a corresponding hole bottom can be obtained. Accordingly, more appropriate selectivity for the given tungsten layer 130 is obtained (see a portion B' in FIG. 5C).

In contrast, as illustrated in FIG. 5B, if the temperature of at least one of the top plate 36 or the sidewall of the processing chamber 10 that is spatially viewed from the substrate W is adjusted to a high temperature, lowly dissociated CxFy polymers, as well as highly dissociated CFz polymers, are absorbed onto the substrate W.

Figure 5D:
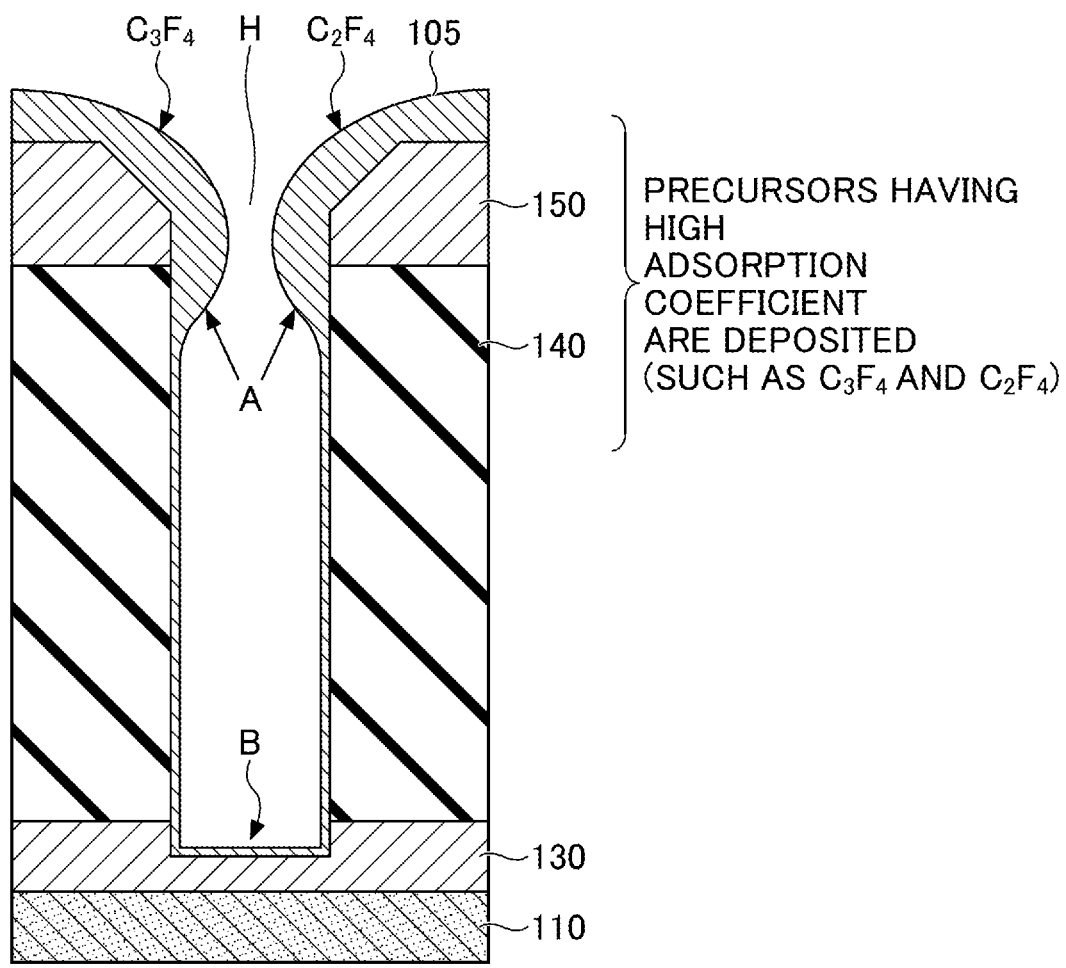

In this case, as illustrated in FIG. 5D, lowly dissociated polymers, such as $C_2F_4$ and $C_3F_4$, having a high adsorption coefficient, adhere to the mask layer 150, and thus mask selectivity is increased. However, clogging is likely to occur where the opening of a given hole H becomes narrower (see a portion A in FIG. 5D). Further, because the opening of the given hole H becomes narrower, the number of polymers reaching a hole bottom is reduced, and consequently selectivity for a given tungsten layer 130 becomes bad (see a portion B in FIG. 5D).

[Temperature Control of Top Plate]

Figure 6A:
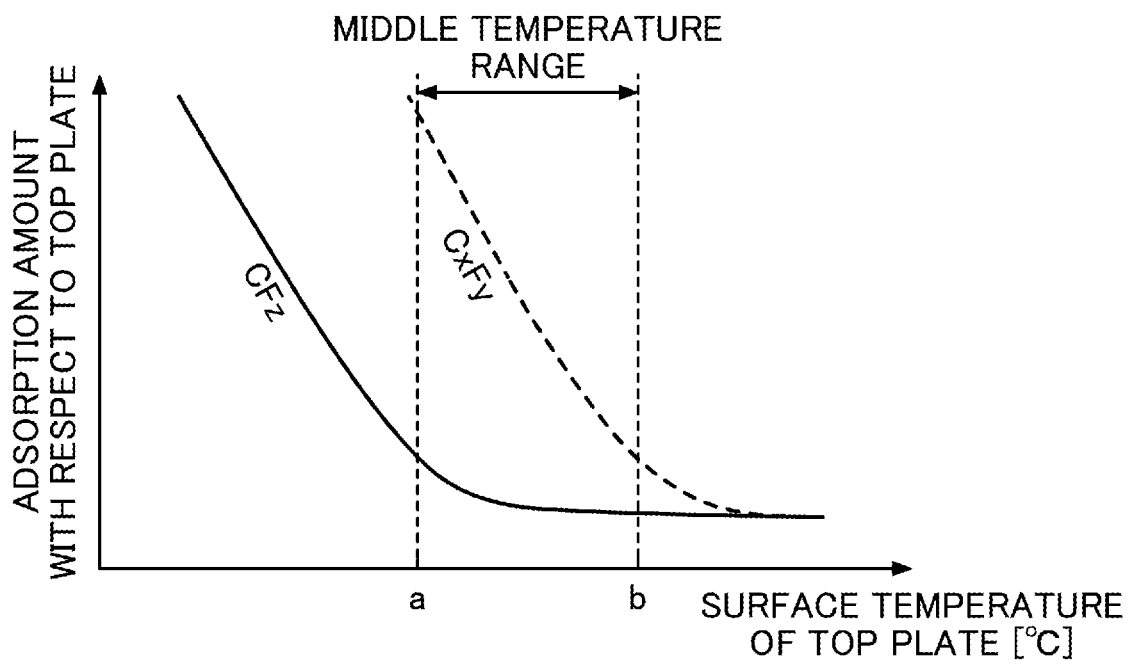
FIG. 6A is a graph illustrating an example of an adsorption amount of each polymer onto a top plate, with respect to a temperature of the top plate.
Figure 6B:
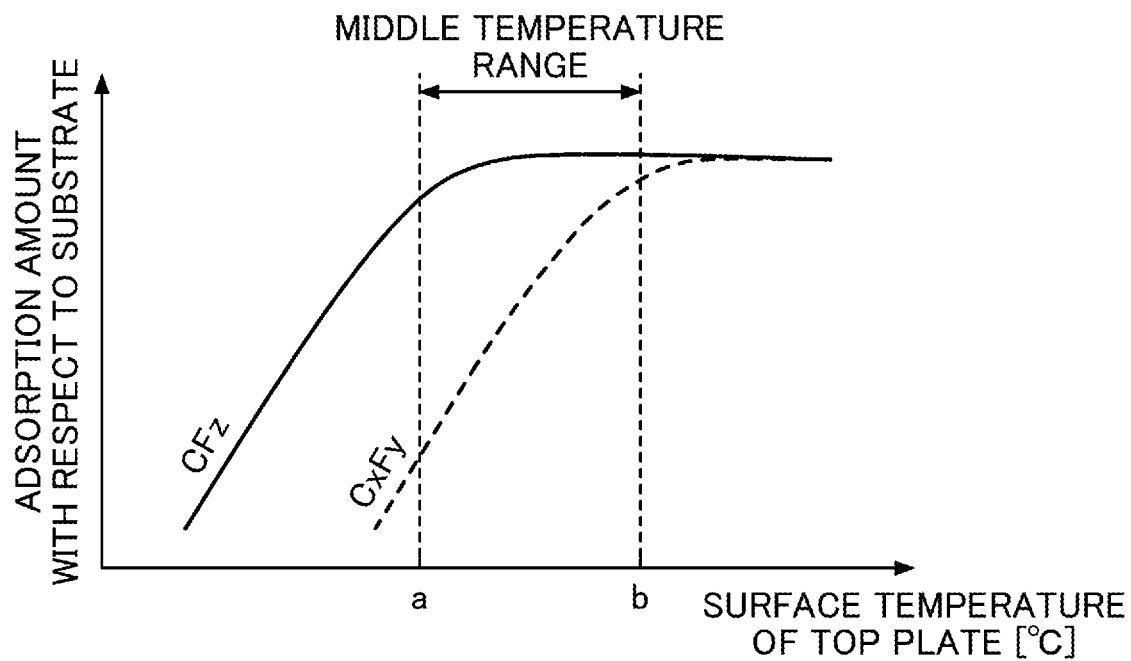
FIG. 6B is a graph illustrating an example of the adsorption amount of each polymer onto a substrate, with respect to the temperature of the top plate.

Hereafter, an appropriate temperature of the surface temperature of the top plate 36 to be adjusted to increase a given selectivity ratio of the silicon oxide layer 140 to a given tungsten layer 130 will be described with reference to FIGS. 6A and 6B. FIG. 6A is a graph illustrating an example of an adsorption amount of each polymer onto the top plate 36, with respect to the surface temperature of the top plate 36. FIG. 6B is a graph illustrating an example of the adsorption amount of each polymer onto the substrate W, with respect to the surface temperature of the top plate 36. In FIGS. 6A and 6B, the horizontal axis represents the surface temperature of the top plate 36. In FIG. 6A, the vertical axis represents the adsorption amount of a given polymer onto the top plate 36. In FIG. 6B, the vertical axis represents the adsorption amount of a given polymer onto the substrate W. For the horizontal axis in each of FIGS. 6A and 6B, the temperature of a° C. (hereafter also referred to as a temperature a) is a temperature at which an adsorption amount of highly dissociated CFz polymers onto the top plate 36 begins to increase with a reduced surface temperature of the top plate 36. Also, the temperature of b° C. (hereafter also referred to as a temperature b) is a temperature at which an adsorption amount for lowly dissociated CxFy polymers onto the top plate 36 begins to increase with a reduced surface temperature of the top plate 36.

From FIGS. 6A and 6B, if the surface temperature of the top plate 36 is higher than the temperature b, the lowly dissociated CxFy polymers and the highly dissociated CFz polymers are less likely to be absorbed onto the top plate 36. As a result, those polymers are mostly absorbed onto the substrate W.

When the surface temperature of the top plate 36 is gradually reduced from the temperature b, the lowly dissociated CxFy polymers, which are likely to be absorbed onto the mask layer 150 in the substrate W, first adhere to the top plate 36. Subsequently, when the surface temperature of the top plate 36 is reduced up to the temperature a, the highly dissociated CFz polymers, which are likely to be absorbed onto a given tungsten layer 130, adhere to top plate 36, in addition to the lowly dissociated CxFy polymers adhering to the top plate 36.

When the surface temperature of the top plate 36 is lower than the temperature a, the lowly dissociated CxFy polymers and the highly dissociated CFz polymers are mostly absorbed onto the top plate 36. As a result, those polymers become less absorbed onto the substrate W.

Figure 7:
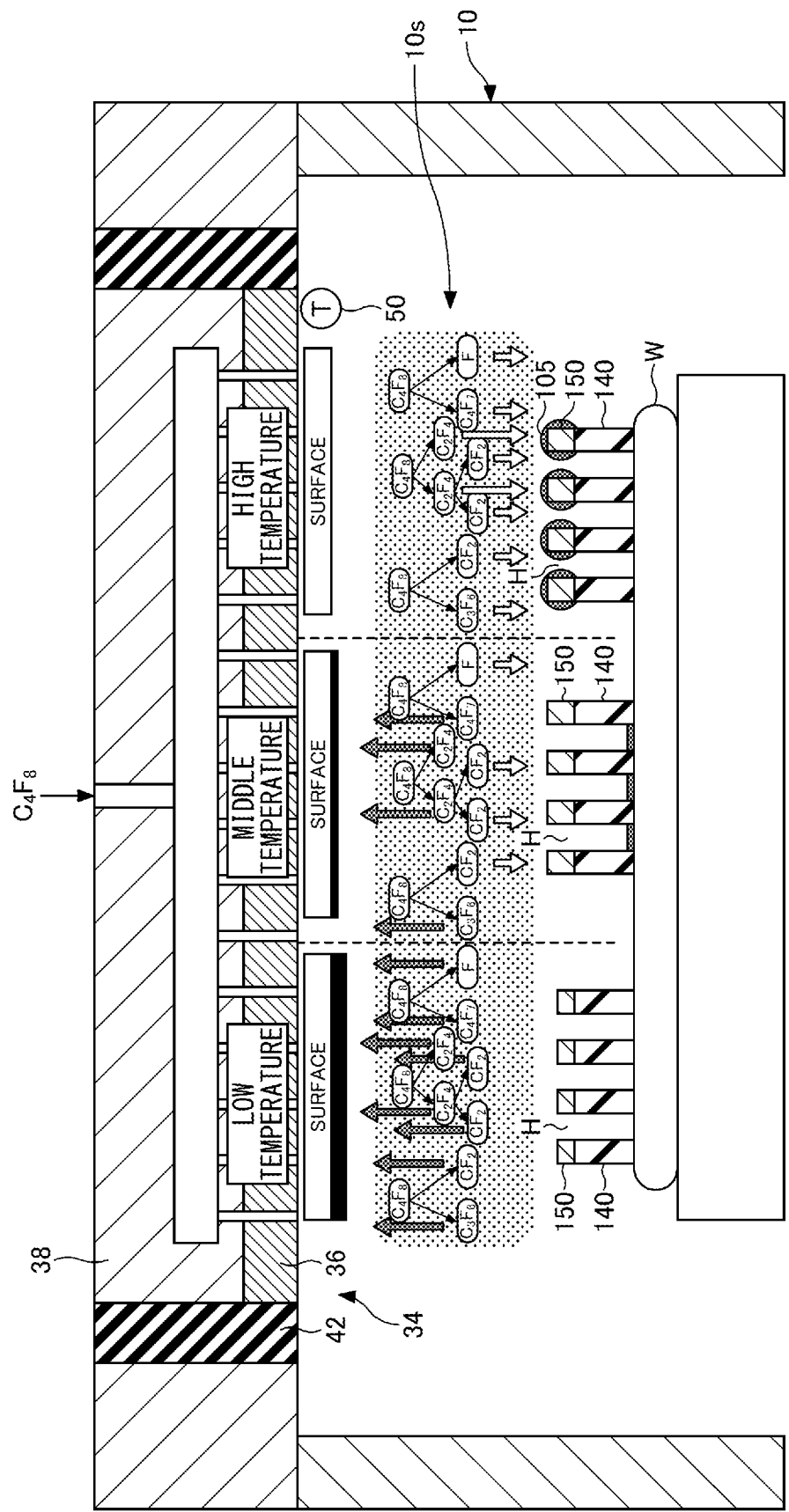
FIG. 7 is a diagram illustrating an example of a state of each polymer under a temperature control of the top plate according to one embodiment.

Referring now to FIG. 7, in the temperature control described above, when $C_4F_8$ gas is supplied to the processing chamber 10, in a case where the surface temperature of the top plate 36 is higher than the temperature b (see "high temperature" in FIG. 7), lowly dissociated CxFy polymers and highly dissociated CFz polymers are absorbed onto the substrate W. In such a case, with adhesion of the lowly dissociated CxFy polymers to the opening in a given hole H, the opening of the given hole H become narrower, and consequently the highly dissociated CFz polymers are less likely to be transferred to the hole bottom. Thus, a given selectivity ratio of the silicon oxide layer 140 to a given tungsten layer 130 is reduced, thereby resulting in a lower etch rate. However, in this case, greater mask selectivity is obtained.

In contrast, when the surface temperature of the top plate 36 is lower than the temperature a (in a case of a "low temperature" in FIG. 7), lowly dissociated CxFy polymers and highly dissociated CFz polymers are absorbed onto the top plate 36. Thus, lowly dissociated precursors ($C_3F_4$ radicals, $C_3F_4^+$ ions, and the like) and highly dissociated precursors ($CF_2$ radical, $CF_2^+$ ions, and the like) hardly reach the substrate W. As a result, a lower etch rate might result, as well as reducing a given selectivity ratio of the silicon oxide layer 140 to a given tungsten layer 130. Further, mask selectivity is reduced.

Thus, by adjusting the surface temperature of the top plate 36 to be within the middle temperature range of from a° C. through b° C. (in a case of a "middle temperature" in FIGS. 6A and 6B), the number of lowly dissociated CxFy polymers absorbed onto the top plate 36 is increased, while reducing the number of CxFy polymers absorbed onto the substrate W. Therefore, clogging can be mitigated without narrowing the opening of a given hole H. Further, highly dissociated CFz polymers are transferred to the substrate W and are used as etchants, and thus a higher etch rate is obtained. Also, the highly dissociated CFz polymers are absorbed onto the bottom of a given tungsten layer 130, thereby allowing for better selectivity for the given tungsten layer 130.

As described above, the surface temperature of the top plate 36 is adjusted to be a temperature in the middle temperature range. In such a manner, due to a difference between given polymer adsorption coefficients each of which depends on molecular weight, CFz radicals and ions effective for obtaining appropriate selectivity for a tungsten layer 130 are transferred to the substrate W, without being trapped on the top plate 36. In contrast, in the temperature control, CxFy radicals and ions to lead to the occurrence of clogging are absorbed onto the top plate 36. Thus, better selectivity for a given tungsten layer 130 can be obtained, while maintaining an appropriate etch rate of the silicon oxide layer 140. Note that mask selectivity can be obtained to indicate an approximately average value of (i) mask selectivity obtained when the surface temperature of the top plate 36 is a higher temperature than the temperature b and (ii) mask selectivity obtained when the surface temperature of the top plate 36 is a lower temperature than the temperature a.

Also, even when the surface temperature of the top plate 36 is adjusted to be in the middle temperature range of from a° C. through b° C., by setting the surface temperature of the top plate 36 to each of the temperature of about a° C. and the temperature of about b° C., a ratio between the lowly dissociated CxFy polymer and the highly dissociated CFz polymer to be absorbed onto the substrate W can be adjusted.

[Test Result]

Figure 8:
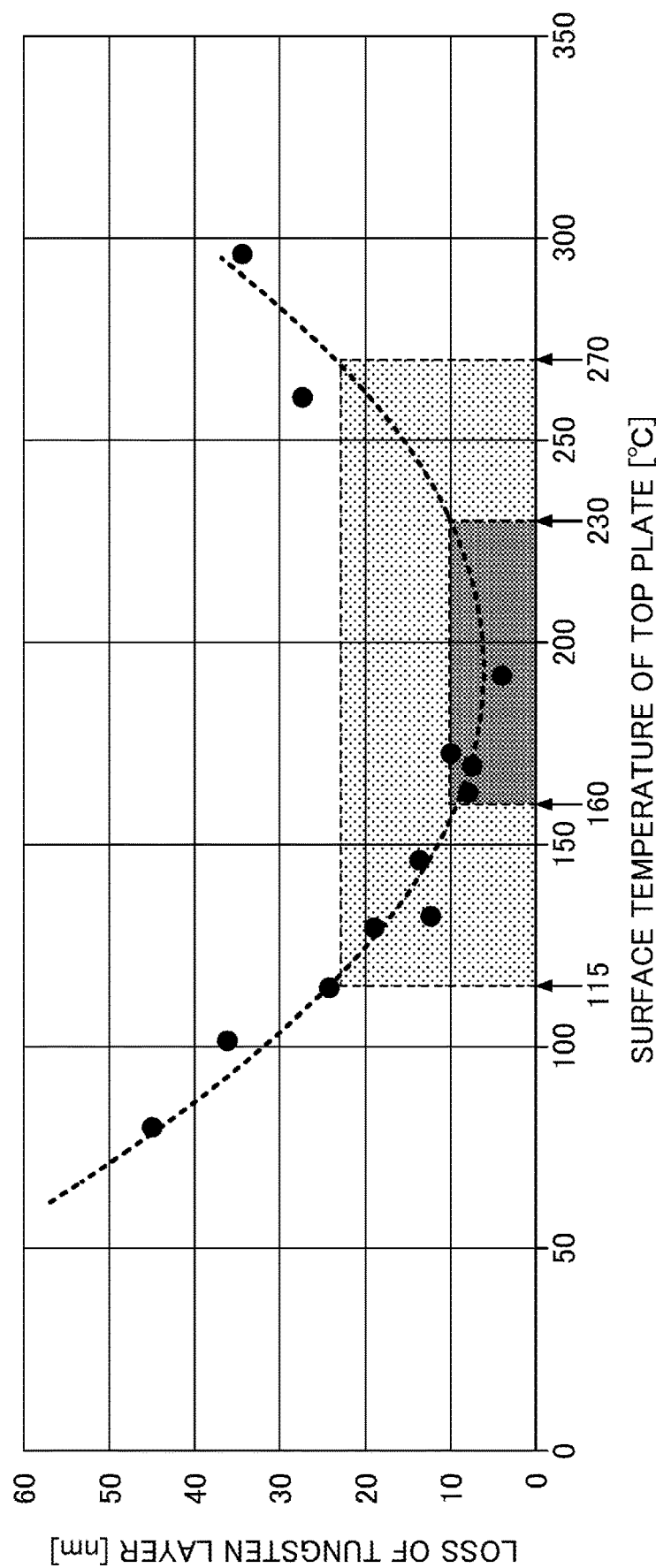
FIG. 8 is a graph illustrating a test result relating to thickness losses in a tungsten layer with respect to a surface temperature of the top plate according to one embodiment.

FIG. 8 is a graph illustrating the test result relating to thickness losses in a given tungsten layer 130 with respect to a surface temperature of the top plate 36 according to one embodiment. On the graph, the horizontal axis represents the surface temperature of the top plate 36, and the vertical axis represents the thickness loss amount of the tungsten layer 130.

In the test, the substrate processing apparatus 1 was used to form a plasma under the process condition below.

<Process Condition>

Gaseous species: $C_4F_6$ gas, CO gas, and $O_2$ gas
Pressure of processing compartment: 20 mT (2.67 Pa)
Radio frequency power for exciting a plasma: 100 MHz
Radio frequency power for drawing ions: 3.2 MHz According to the test result, in order to reduce the loss thickness amount of the tungsten layer 130 to about 24 nm or less, it has been found that the surface temperature of the top plate 36 is preferably adjusted to be in the range of from 115° C. through 270° C. Further, in order to reduce the thickness loss amount of the tungsten layer 130 to about 10 nm or less, it has been found that the surface temperature of the top plate 36 is preferably adjusted to be in the range of from 160° C. through 230° C.

Note that in the test, a given substrate having a laminate film was used. The laminate film included (i) a silicon oxide layer 140 as an etching film, and (ii) tungsten layers 130 as underlying layers. Polymers used as (i) etchants to facilitate etching of the etching film, or (ii) precursors lead to the acquirement of better selectivity for the underlying layers, might differ slightly depending on film types of a given laminate film. In light of the situation described above, an appropriate surface temperature range of the top plate 36 might also differ slightly. In this case, in order to determine an appropriate surface temperature range based on a film type of a laminate film actually used, it is desirable to perform (i) a test using the actually-used laminate film, or (ii) a simulation or the like in which precursors are generated or precursors are reacted at the surface of the actually-used laminate film.

Also, because a dissociation pattern in process gas varies depending on gaseous species employed, an appropriate surface temperature range of the top plate 36 might vary slightly. Note that in the test or the like, the following information is obtained in advance in order to determine an appropriate surface temperature of the top plate 36.

(i) a combination of film types relating to a given etching film (silicon-containing insulating layer) and a given underlying layer.

(ii) a combination of gaseous species with the combined film types described in (i) above.

The obtained information is stored in a storage in the controller 100. For example, the information may be stored in a database. By such a configuration, in a step (step S2 below) in which a surface temperature range of the top plate 36 is selected, by referring to the storage, a range of from a° C. through b° C. can be selected as the surface temperature range of the top plate 36, as described below.

[Etching Method]

Figure 9:
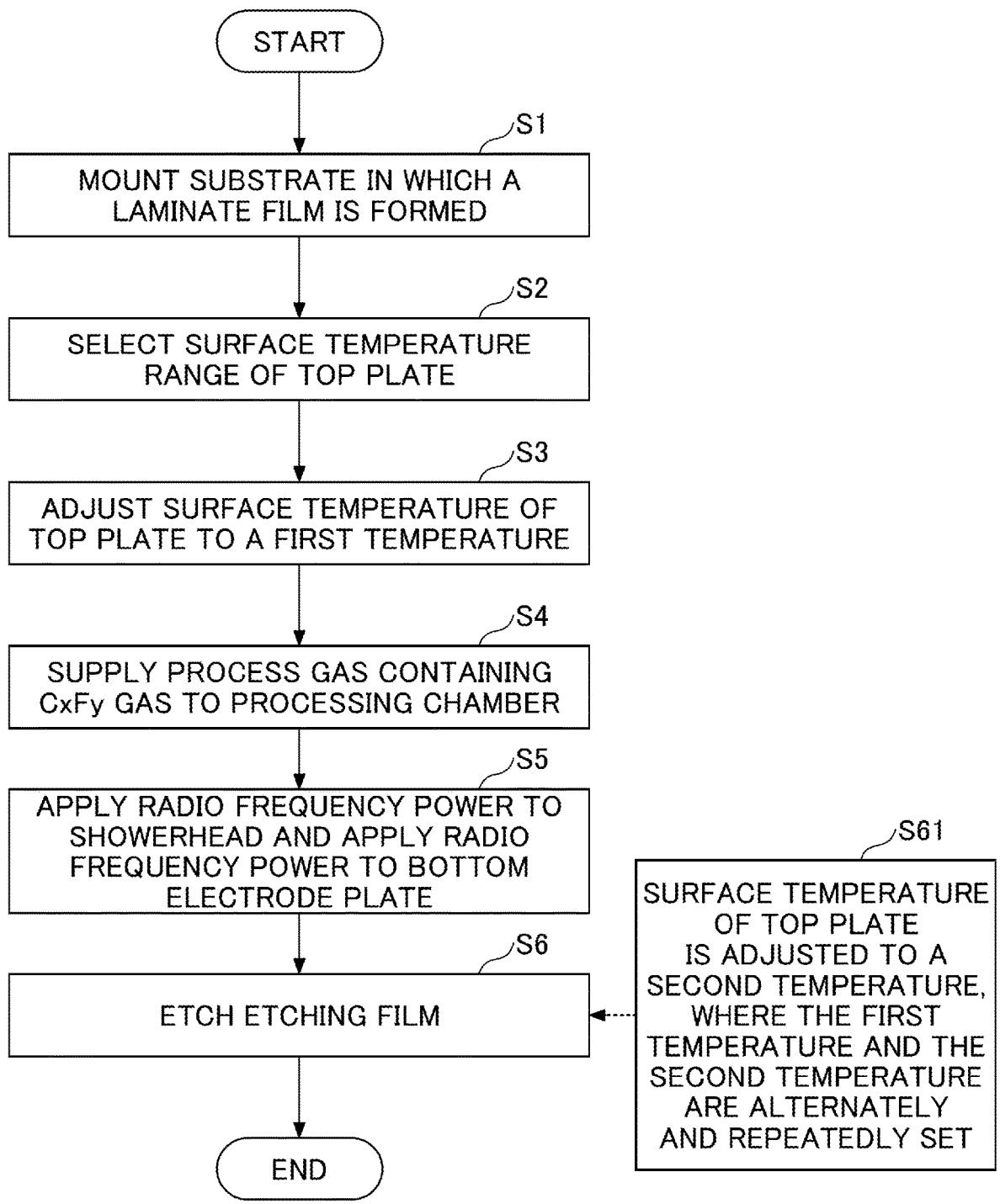
FIG. 9 is a flowchart illustrating an example of an etching method according to one embodiment.

In view of the test result described above, an etching method for execution by the substrate processing apparatus 1 will be described with reference to FIG. 9, where under control by the controller 100, the surface temperature of the top plate 36 is adjusted to be in the middle temperature range of from a° C. through b° C. FIG. 9 is a flowchart illustrating an example of the etch method according to one embodiment. In this example, when the silicon oxide layer 140, as an etching film, is etched, a thickness loss amount of a given tungsten layer 130 is reduced to about 10 nm or less, thereby allowing for an increased selectivity ratio of the silicon oxide layer 140 to the given tungsten layer 130.

In the process, first, a given substrate W in which a laminate film is formed is transferred to the processing chamber 10, and then is mounted on the stage ST (step S1). The laminate film includes (i) the silicon layer 110, (ii) tungsten layers 130 located at different height levels, (iii) the silicon oxide layer 140 as an etching layer, and (iv) the mask layer 150.

Then, a given surface temperature range of the top plate 36 is selected based on a combination of film types of the etching film and a given underlying film in the substrate W, where the selected temperature range is the middle temperature range of from a° C. through b° C. (step S2). For example, as in the laminate film described in the test result in FIG. 8, when the silicon oxide layer 140 is formed as an etching film, and each of the tungsten layers 130 is formed as an underlying film, the selected given surface temperature of the top plate 36 is a range of from 160° C. through 230° C. Note that when film types of a given laminate film are identified in advance, step S2 may be performed before step S1, or may be performed simultaneously with step S1.

Then, a given surface temperature of the top plate 36 is adjusted to a first temperature in the temperature range selected in step S2 (step S3). The first temperature is a preset temperature in the range of from 160° C. through 230° C.

Then, process gas that contains fluorocarbon gas (CxFy gas), such as $C_4F_6$ gas, is supplied to the processing chamber 10 (step S4). Subsequently, radio frequency power for exciting a plasma is applied to the showerhead 34, and radio frequency power for drawing ions is applied to the bottom electrode plate 16. Thus, a plasma is formed from the process gas that contains fluorocarbon gas (step S5). In step S4, only radio frequency power for exciting a plasma may be used.

Then, the silicon oxide layer 140 as an etching film is etched (step S6). During etching of the silicon oxide layer 140, the surface temperature of the top plate 36 is adjusted to be in the range of from 160° C. through 230° C. For example, as in step S61 below, for the surface temperature of the top plate 36, a first temperature and a second temperature different from the first temperature (e.g., the first temperature>the second temperature) may be alternately and repeatedly set, where the first temperature and the second temperature are within the range of from 160° C. through 230° C. When etching of the silicon oxide layer 140 is completed, the process is terminated.

In the etching method according to one embodiment, during etching of the silicon oxide layer 140, the surface temperature of the top plate 36 is adjusted within the range of from 160° C. through 230° C. In such a manner, highly dissociated CFz radicals and ions effective to obtain appropriate selectivity for a given tungsten layer 130 are mainly transferred to a given substrate W, without being trapped on the top plate 36. In contrast, lowly dissociated CxFy radicals and ions to lead to the occurrence of clogging are mainly absorbed onto the top plate 36. Accordingly, better selectivity for a given tungsten layer 130 can be obtained, while maintaining an appropriate etch rate of the silicon oxide layer 140.

Also, by adjusting the surface temperature of the top plate 36 such that a first temperature and second temperature are alternately and repeatedly set within the range of from 160° C. through 230° C., a ratio for radicals and ions that are trapped on the top plate 36, with respect to of a group of the CFz radical and ion, to a group of the CxFy radical and ion, can be varied. Thus, a given etch rate of the silicon oxide layer 140, as well as selectivity for a given tungsten layer 130, can be finely adjusted.

[Modifications]

Figure 10:
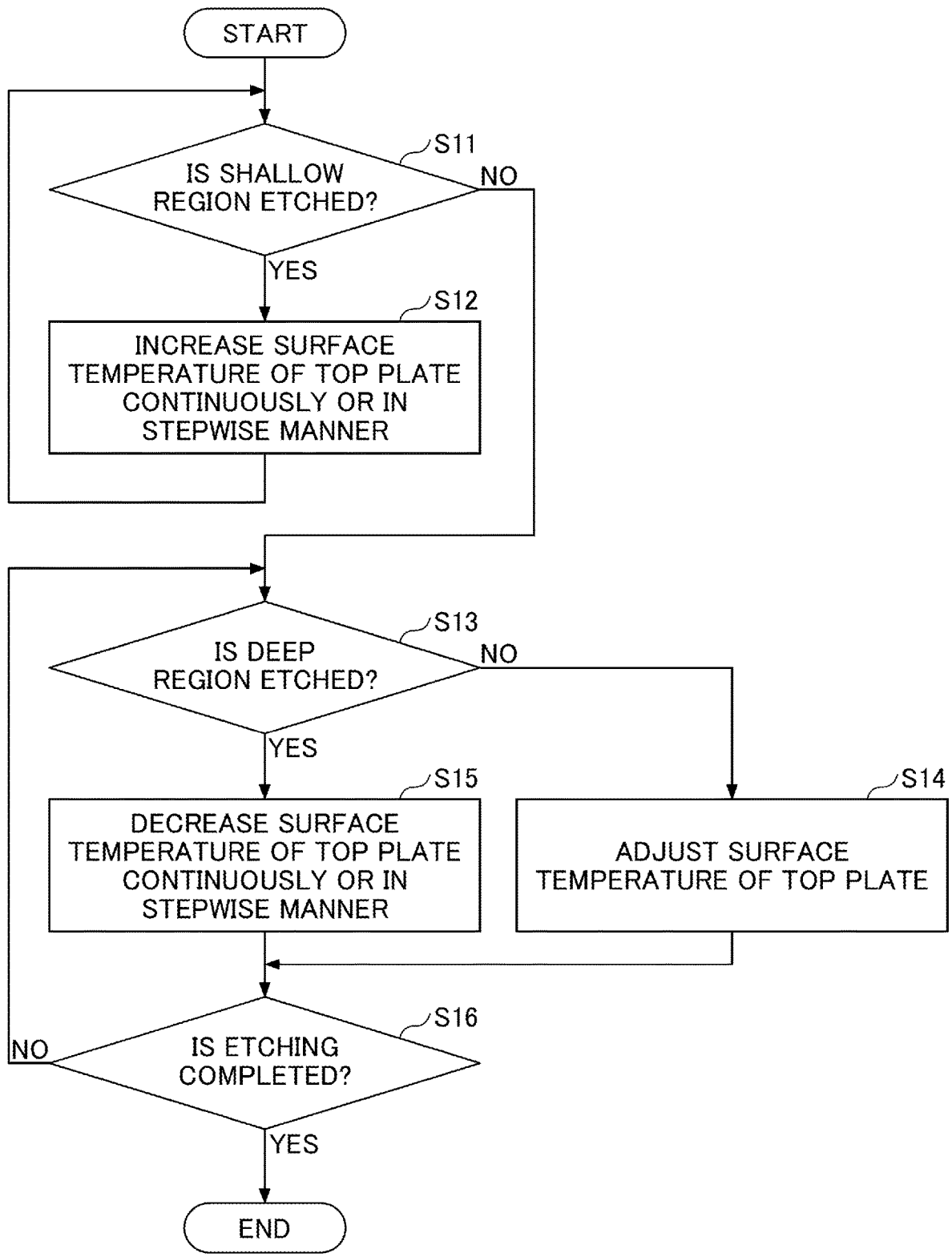
FIG. 10 is a flowchart illustrating an example of a temperature control method of the top plate used in the etching method according to the modification of the embodiment.

Hereafter, in the etching method according to the modification of the present embodiment, a temperature control method of the top plate 36 will be described with reference to FIG. 10 and FIG. 11. FIG. 10 is a flowchart illustrating an example of the temperature control method of the top plate 36 used in the etching method according to the modification of the embodiment. FIGS. 11A and 11b are diagrams for describing the temperature control method illustrated in FIG. 10.

According to the modified embodiment, in step S6 illustrated in FIG. 9 in which the silicon oxide layer 140 is etched, instead of step S61, the temperature control method of the top plate 36 is performed, as illustrated in FIG. 10. The temperature control method illustrated in FIG. 10 is performed using the controller 100.

In the description in FIG. 10, the substrate W includes a laminate film having three tungsten layers 130 and the silicon oxide layer 140, as illustrated in FIG. 2, and the silicon oxide layer 140 is etched. For the surface of the silicon oxide layer 140, the following regions are preset.

(i) A shallow region from the top of the silicon oxide layer 140 to a first stage tungsten layer 130 that is located first from the top of the silicon oxide layer 140

(ii) A middle region from the first stage tungsten layer 130 to a second stage tungsten layer 130 that is located second from the top of the silicon oxide layer 140

(iii) A deep region from the second stage tungsten layer 130 to a third stage tungsten layer 130 that is located last from the top of the silicon oxide layer 140

Note, however, that the laminate film structure described above is simplified for the purpose of illustration, and is not limited to the example described above.

In step S6 illustrated in FIG. 9, when the temperature control method illustrated in FIG. 10 is performed, it is determined whether the shallow region of the silicon oxide layer 140 is etched (step S11). Before the silicon oxide layer 140 is etched to a depth at which the first stage tungsten layer 130 is disposed, it is determined that the shallow region of the silicon oxide layer 140 is etched. In this case, the surface temperature of the top plate 36 is increased continuously or in a stepwise manner, such that the increased surface temperature is within the range of from a° C. through b° C. (step S12).

Figure 11A:
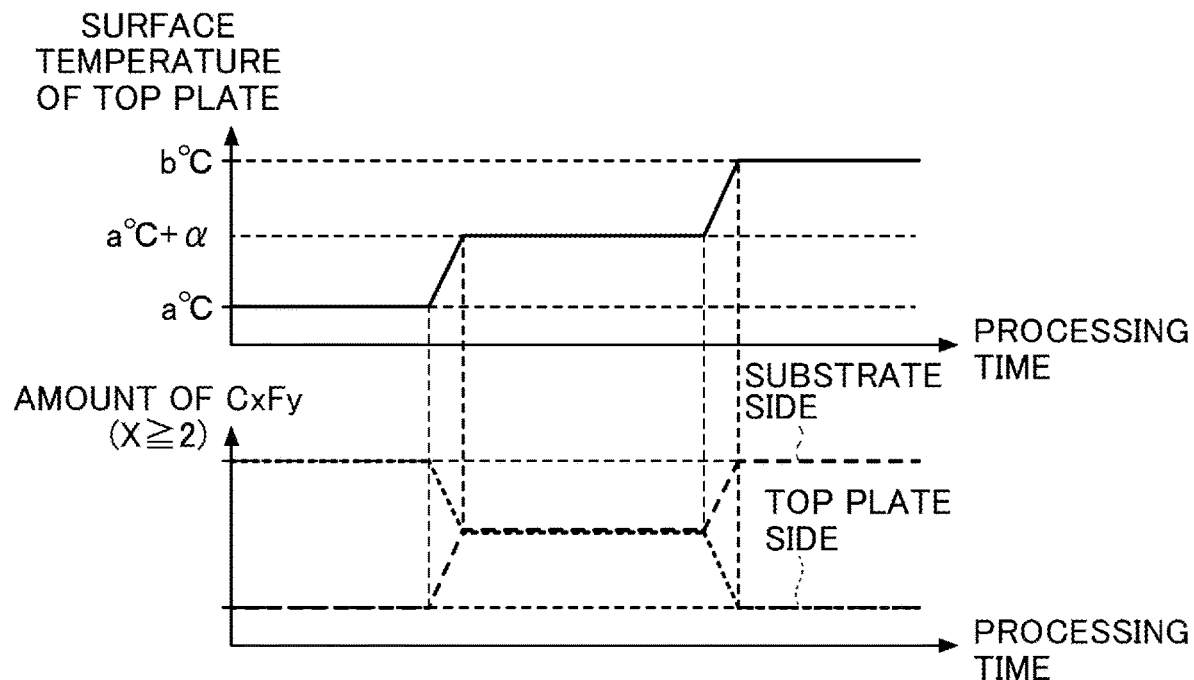
FIGS. 11A and 11B are diagrams for describing the temperature control method illustrated in FIG. 10.

In the example in FIG. 11A, for etching of the shallow region ranged from the top of the silicon oxide layer 140 to the first stage tungsten layer 130, among the tungsten layers 130 of three stages (N=3), the surface temperature of the top plate 36 is increased in a three level manner, by the lapse of processing time. Where, temperatures set in the three level manner includes (i) a° C., (ii) (a+α)° C., and (iii) b° C. In FIG. 11A, the horizontal axis represents the processing time, and the vertical axis represents the surface temperature of the top plate 36. In such a case, in etching of the shallow region, the surface temperature of the top plate 36 is first adjusted to the temperature of a° C., such that lowly dissociated CxFy radicals and ions become likely to be trapped on the top plate 36. Thus, highly dissociated CFz radicals and ions having a low adsorption coefficient are transferred to a given hole bottom, without narrowing the opening of a given hole H. Accordingly, the resulting CFz polymers lead to the acquirement of better selectivity for a given tungsten layer 130.

Subsequently, by increasing the surface temperature of the top plate 36 in a stepwise manner, the surface temperature of the top plate 36 is adjusted to the temperature of b° C., at a last phase of etching of the shallow region. Thus, CxFy radicals and ions are transferred to the substrate W. In such a manner, the resulting CxFy polymers adhere to the opening of a given hole H, thereby increasing mask selectivity.

Then, when the silicon oxide layer 140 is etched to a depth at which the first stage tungsten layer 130 is disposed, it is determined in step S11 that the shallow region of the silicon oxide layer 140 is not etched (NO in the step), and then etching of the shallow region of the silicon oxide layer 140 is terminated. Next, it is determined whether the deep region of the silicon oxide layer 140 is etched (step S13). While the silicon oxide layer 140 is etched to a depth at which the second stage tungsten layer 130 is disposed, it is determined that the deep region of the silicon oxide layer 140 is not etched (in this example, the middle region between the shallow region and the deep region is etched).

In this case, the surface temperature of the top plate 36 is adjusted to a temperature of (a+α)° C. in the range of from a° C. through b° C. (step S14). For example, the surface temperature of the top plate 36 may be adjusted to maintain the temperature of b° C. that is last set in step S12, or may be adjusted to another temperature in the range of from a° C. through b° C.

When the silicon oxide layer 140 is etched to a depth at which the third stage tungsten layer 130 is disposed, and thus it is determined that the deep region of the silicon oxide layer 140 is etched, the surface temperature of the top plate 36 is reduced continuously or in a stepwise manner, such that the reduced temperature is within the range of from a° C. through b° C. (step S15).

Figure 11B:
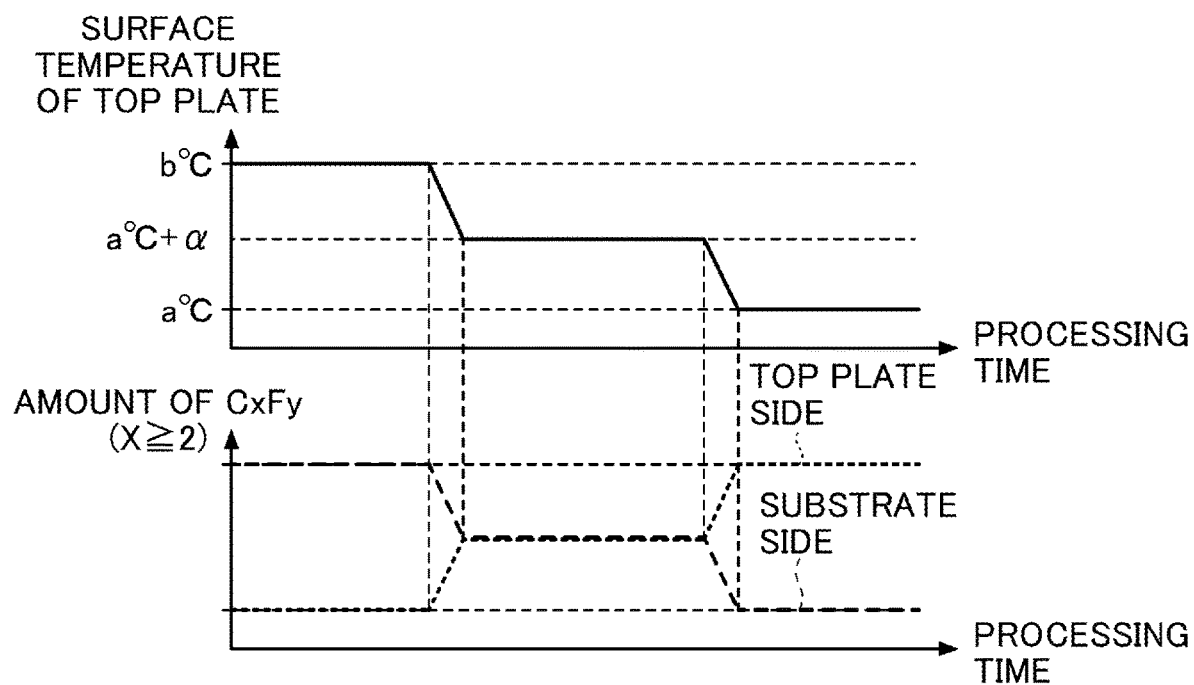

In the example in FIG. 11B, for etching of the deep region ranged from the second stage tungsten layer 130 to the third stage tungsten layer 130, among the tungsten layers 130 of three stages (N=3), the surface temperature of the top plate 36 is decreased in a three level manner, by the lapse of processing time, where temperatures set in the three level manner includes (i) b° C., (ii) (a+a)° C., and (iii) a° C. In this case, the effect of etching at a first phase (temperature of b° C.) for the deep region can be obtained, as in the above-mentioned effect of etching at the last phase (temperature of b° C.) for the shallow region in FIG. 11A. Also, in FIG. 11B, the effect of etching at a last phase (temperature of a° C.) for the deep region can be obtained, as in the above-mentioned effect of etching at the first phase (temperature of a° C.) for the shallow region in FIG. 11A.

According to the modification, by adjusting the surface temperature of the top plate 36 to be within the range of from a° C. through b° C., an appropriate etch rate is maintained while reducing the thickness losses in the tungsten layers 130. In this case, the adjusted surface temperature of the top plate 36 varies depending on depths to which the silicon oxide layer 140 is etched. For example, for the shallow region where the silicon oxide layer 140 is etched to a shallow depth level, the adjusted surface temperature of the top plate 36 may be increased as the etched silicon oxide layer 140 is deeper. Also, for the deep region where the silicon oxide layer 140 is etched to a deeper depth level, the adjusted surface temperature of the top plate 36 may be decreased as the etched silicon oxide layer 140 is deeper. In such a manner, by the temperature control to mainly emphasize selectivity for a given tungsten layer 130, as well as the temperature control to mainly emphasize mask selectivity, a state of the polymers that adheres to the substrate W can be finely set. Note that the surface temperature of the top plate 36 is not limited to being increased or decreased in a stepwise manner, and may be continuously increased or decreased.

As described above, according to the etching method and the substrate processing apparatus 1 according to the present embodiment and modifications, the surface temperature of the top plate 36 is adjusted to be in an appropriate range. Specifically, during an etch process, the surface temperature of the top plate 36 is adjusted to an appropriate temperature in the range of from a° C. through b° C. Thus, with respect to highly dissociated CFz radicals and ions that influence selectivity for a given tungsten layer 130, as well as lowly dissociated CxFy radicals and ions that result in occurrence of clogging, amounts of those radicals and ions to be trapped on the top plate 36 can be determined. Accordingly, better selectivity for the given tungsten layer 130 can be obtained while maintaining an appropriate etch rate of the silicon oxide layer 140.

Further, as a secondary effect, a lower flow rate of $O_2$ gas in process gas can be obtained, or addition of $O_2$ gas can be eliminated. Conventionally, $O_2$ gas is added to process gas in order to suppress clogging near the mask layer 150 through a plasma from the $O_2$ gas. In contrast, in the etching method according to the embodiments and modifications, by adjusting the surface temperature of the top plate 36 to be in an appropriate temperature range, lowly dissociated CxFy radicals and ions can be mainly trapped on the top plate 36. Thus, with use of the resulting CxFy polymers, narrowing of the opening of a given hole can be suppressed. Further, by adjusting a given flow rate of $O_2$ gas in process gas, the opening shape of a given hole H can be finely adjusted. Further, better selectivity for a given tungsten layer 130 can be obtained.

[Temperature Control for Each Region]

Figure 12A:
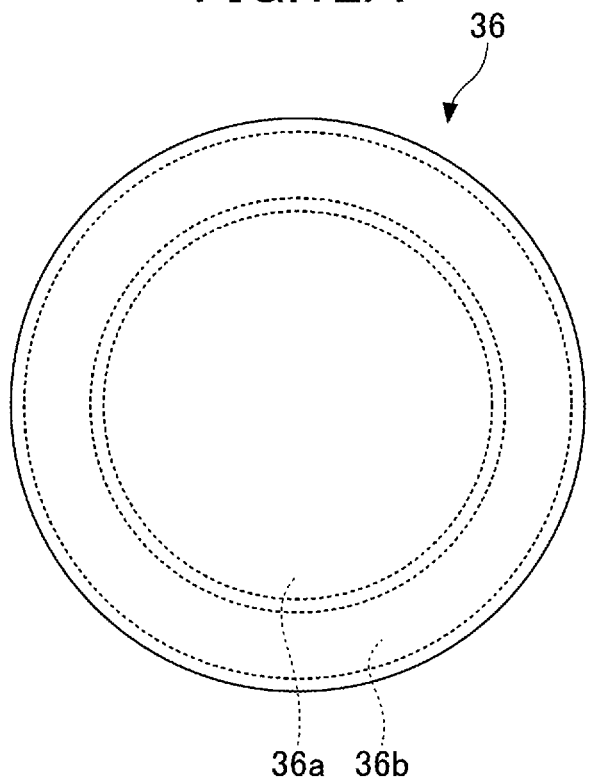
FIGS. 12A to 12C are diagrams illustrating an example of regions of the top plate set for a temperature control according to one embodiment.
Figure 12B:
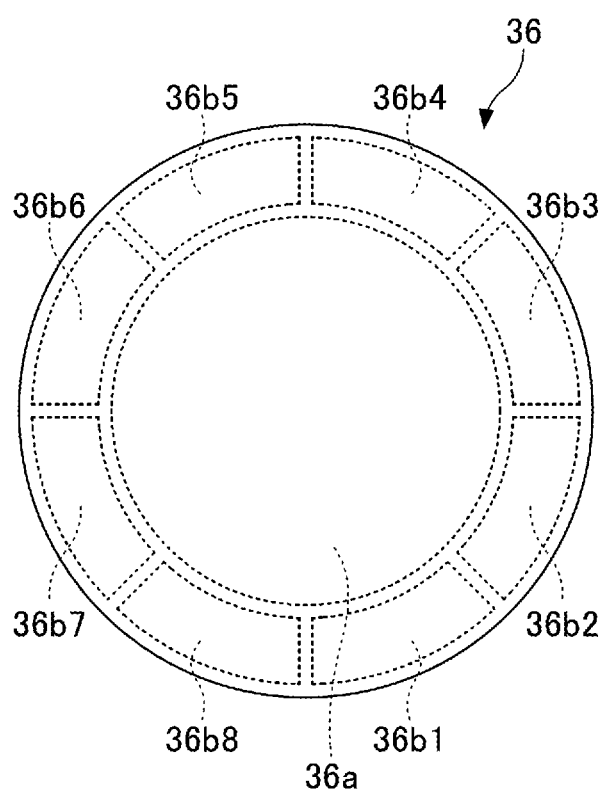
Figure 12C:
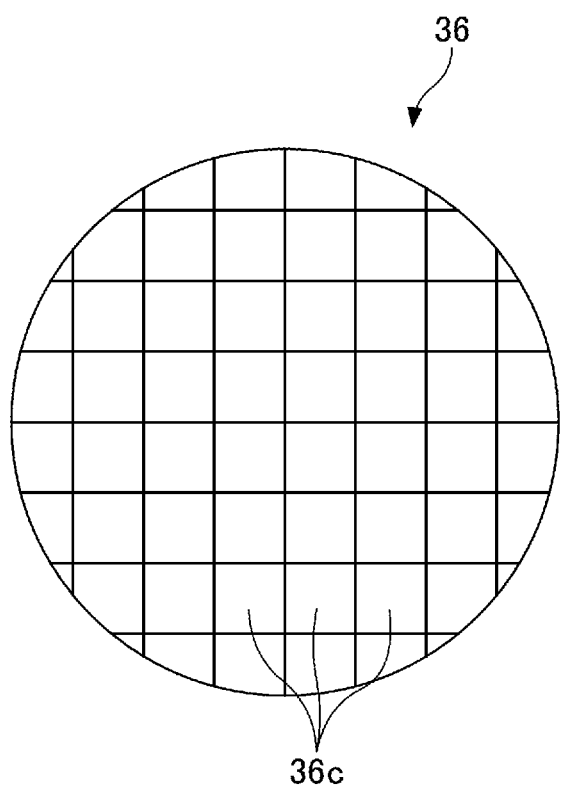

The top plate 36 is disk-shaped, and the temperature of the top plate 36 can be independently adjusted for each of regions of the top plate 36. FIGS. 12A to 12C are diagrams illustrating an example of regions of the top plate set for a temperature control according to one embodiment. In the example in each of FIGS. 12A to 12C, the bottom of the top plate 36 is partitioned into temperature-controlled regions.

In FIG. 12A, the top plate 36 includes a central region 36a and an outer region 36b radially located outward from the central region 36a. Respective heaters 45 are provided for the central region 36a and the outer region 36b, and temperatures of the central region 36a and the outer region 36b are separately adjusted by the respective heaters 45. Thus, non-uniformity occurring in a temperature distribution on the bottom of the top plate 36 is mitigated, thereby allowing for increased uniformity in a given temperature distribution on the bottom of the top plate 36.

In FIG. 12B, the top plate 36 includes a central region 36a and an outer region radially located outward from the central region 36a. The outer region includes radially disposed regions 36b1 to 36b8. In such a manner, respective heaters 45 are provided with respect to the central region 36a and the regions 36b1 to 36b8, and temperatures of the central region 36a and the regions 36b1 to 36b8 are individually adjusted by the respective heaters 45. Thus, non-uniformity occurring in a radially shown temperature distribution for the top plate 36, as well as non-uniformity occurring in a circumferentially shown temperature distribution for the top plate 36, are mitigated, thereby allowing for further increased uniformity in a given temperature distribution on the bottom of the top plate 36.

In FIG. 12C, the top plate 36 includes regions 36c arranged in a grid pattern. In such a manner, respective heaters 45 are provided with respect to the regions 36c, and temperatures of the regions 36c are individually adjusted by the respective heaters 45. By such a configuration, increased uniformity in a given temperature distribution on the bottom of the top plate 36 can be provided.

Note, however, that the temperature-controlled regions of the top plate 36 are not limiting. For example, in FIG. 12A, the top plate 36 is partitioned into two radially disposed regions. However, the top plate 36 is partitioned into three or more regions radically disposed, and temperatures of the regions may be individually adjusted. In FIG. 12B, for the outer region of the top plate 36, it is partitioned into radially disposed regions. However, each of the central region of the outer region may be partitioned into multiple regions. Alternatively, only the central region may be partitioned into multiple regions. In FIG. 12C, the top plate 36 is partitioned into regions that are arranged in a grid pattern. However, the shape of the partitioned region is not limited to a rectangle, and may be a triangle, a honeycomb shape, or a polygon other than a quadrangle.

The etching method and substrate processing apparatus according to the embodiments and modified embodiments have been described. While the certain embodiments have been described, these embodiments and modifications have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

In the etching method according to the embodiments, a given temperature-controlled member in the processing chamber 10 is applied is not limited to the top plate 36. Such a temperature-controlled member in the processing chamber 10 may be at least one of a member facing a given substrate W or a member provided in a plan view to encircle the given substrate W. For example, the member facing the given substrate W, as the temperature-controlled member, includes the top plate 36. Alternately, the insulating ring 42 located with respect to the outer periphery of the top plate 36 may be used as the controlled-temperature member. For example, the member provided in a plan view to encircle the given substrate W includes (i) the edge ring 24 located to encircle an edge of the given substrate W, (ii) the insulating ring 26 located with respect to the outer periphery of the edge ring 24, or (iii) the shield 11 against deposits. Also, as the temperature-controlled member in the processing chamber 10, a portion (e.g., an inner region or an outer region) of the member may be adopted when the bottom of top plate 36 is partitioned into regions.

The substrate processing apparatus in the present disclosure is applicable to any type selected from among a capacitively coupled plasma (CCP), an inductively coupled plasma (ICP), a radial line slot antenna (RLSA), an electron cyclotron resonance plasma (ECR), and a helicon wave plasma (HWP).

According to one aspect of the present disclosure, a selectivity ratio of an etching film to an underlying layer can be increased.

What is claimed is:

1. An etching method comprising:
   mounting a substrate on a stage in a processing chamber, the substrate including a laminate film that includes at least (i) a silicon-containing insulating layer, (ii) an underlying layer disposed in the silicon-containing insulating layer, and (iii) a mask layer disposed in an upper layer of the silicon-containing insulating layer;
   supplying process gas to the processing chamber, the process gas including at least one of fluorocarbon gas or hydrofluorocarbon gas;
   selecting, based on a combination of material of the silicon-containing insulating layer and material of the underlying layer, a surface temperature range of at least one member of a first member or a second member in the processing chamber, the first member facing the substrate, and the second member being provided to encircle the substrate;
   adjusting a surface temperature of the one member to be within the selected surface temperature range; and
   forming a plasma in the processing chamber to which the process gas is supplied, thereby etching the silicon-containing insulating layer.

2. The etching method according to claim 1, wherein in the adjusting of the surface temperature of the at least one member, the adjusted surface temperature varies in accordance with a depth to which the silicon-containing insulating layer is etched.

3. The etching method according to claim 2, wherein the adjusted surface temperature is increased with an increasing depth of etching of the silicon-containing insulating layer, with respect to a shallow region where the silicon-containing insulating layer is etched to a first depth level, and
   wherein the adjusted surface temperature is decreased with an increasing depth of the etching of the silicon-containing insulating layer, with respect to a deep region where the silicon-containing insulating layer is etched to a second depth level greater than the first depth level.

4. The etching method according to claim 1, wherein in the adjusting of the surface temperature of the at least one member, the adjusted surface temperature is alternately and repeatedly set to a first temperature and a second temperature different from the first temperature.

5. The etching method according to claim 1, wherein the at least one member is the first member facing the substrate.

6. The etching method according to claim 5, wherein the first member is a top plate in the processing chamber.

7. The etching method according to claim 6, wherein the top plate is disk-shaped and a surface of the top plate facing the stage of the top plate is partitioned into regions, wherein in the adjusting of the surface temperature of the at least one member, a temperature of the top plate is individually adjusted for each of the partitioned regions.

8. The etching method according to claim 1, wherein the silicon-containing insulating layer includes at least one layer selected from the group consisting of a silicon oxide layer, a silicon nitride layer, a laminate layer of the silicon oxide layer and the silicon nitride layer, and a low-k film layer.

9. The etching method according to claim 1, wherein the underlying layer is a conductive layer.

10. The etching method according to claim 9, wherein the conductive layer includes a metal layer or a silicon layer.

11. The etching method according to claim 10, wherein the metal layer is formed of tungsten.

12. The etching method according to claim 1, wherein the silicon-containing insulating layer is formed of a silicon oxide layer, and
wherein the underlying layer is formed of a silicon nitride layer.

13. The etching method according to claim 1, wherein the silicon-containing insulating layer is formed of at least one of a silicon oxide layer or a low-k film layer, and
wherein the underlying layer is formed of at least one of a silicon carbide layer or a silicon carbonitride layer.

14. The etching method according to claim 1, wherein the silicon-containing insulating layer is formed of a silicon oxide layer,
wherein the underlying layer is formed of tungsten, and
wherein in the adjusting of the surface temperature of the at least one member, the adjusted surface temperature is set to be in a range of from 115° C. through 270° C.

15. The etching method according to claim 14, wherein the adjusted surface temperature is set to be in a range of from 160° C. through 230° C.

* * * * *